United States Patent [19]
Chung

[11] Patent Number: 6,097,095

[45] Date of Patent: Aug. 1, 2000

[54] ADVANCED FABRICATION METHOD OF INTEGRATED CIRCUITS WITH BORDERLESS VIAS AND LOW DIELECTRIC-CONSTANT INTER-METAL DIELECTRICS

[75] Inventor: Henry Chung, Cupertino, Calif.

[73] Assignee: AlliedSignal Inc., Morristown, N.J.

[21] Appl. No.: 09/328,644

[22] Filed: Jun. 9, 1999

[51] Int. Cl.[7] .................. H01L 23/485; H01L 21/4763
[52] U.S. Cl. .................. 257/774; 257/759; 257/760; 438/637; 438/624; 438/672; 438/700; 438/738; 438/780
[58] Field of Search .................. 257/506, 750, 257/759, 774, 752; 438/624, 672, 675, 780, 738, 700, 633, 637

[56] References Cited

U.S. PATENT DOCUMENTS

| | | | |
|---|---|---|---|
| 5,801,095 | 9/1998 | Yew et al. | 438/624 |
| 5,886,410 | 8/1999 | Chiang et al. | 257/759 |
| 5,935,868 | 8/1999 | Fang et al. | 438/692 |

OTHER PUBLICATIONS

"High Stud–to–Line Contact Area in Damascene Metal Processing"; IBM Technical Disclosure Bulletin, vol. 33, No. IA Jun. 1990.

*Primary Examiner*—Wael Fahmy
*Assistant Examiner*—Hsien-Ming Lee
*Attorney, Agent, or Firm*—Leslie A. Weise

[57] ABSTRACT

The invention relates to the formation of structures in microelectronic devices such as integrated circuit devices by means of borderless via architectures in intermetal dielectrics. An integrated circuit structure has a substrate, a layer of a second dielectric material on the substrate and spaced apart metal contacts on the second dielectric. A space between adjacent metal contact side walls is filled with the second dielectric material. A ledge of a first dielectric material is on top of each second dielectric material filled space. The ledges are attached to adjacent side walls such that each ledge either fully spans the width of the filled space between adjacent side walls; or partially spans the width of the filled space between adjacent side walls, and the area between adjacent ledges is filled with second dielectric material. A top surface of each of the metal contacts, a top surface of the ledges and a top surface of any filled areas between adjacent ledges are at a common level. An additional layer of the second dielectric material is on at least some of the metal contacts, the ledges and optionally the filled areas between adjacent ledges. At least one via extends through the additional layer of the second dielectric material and extends to the top surface of the metal contacts and optionally at least one of the ledges. The first and second dielectric materials have substantially different etch resistance properties.

12 Claims, 39 Drawing Sheets

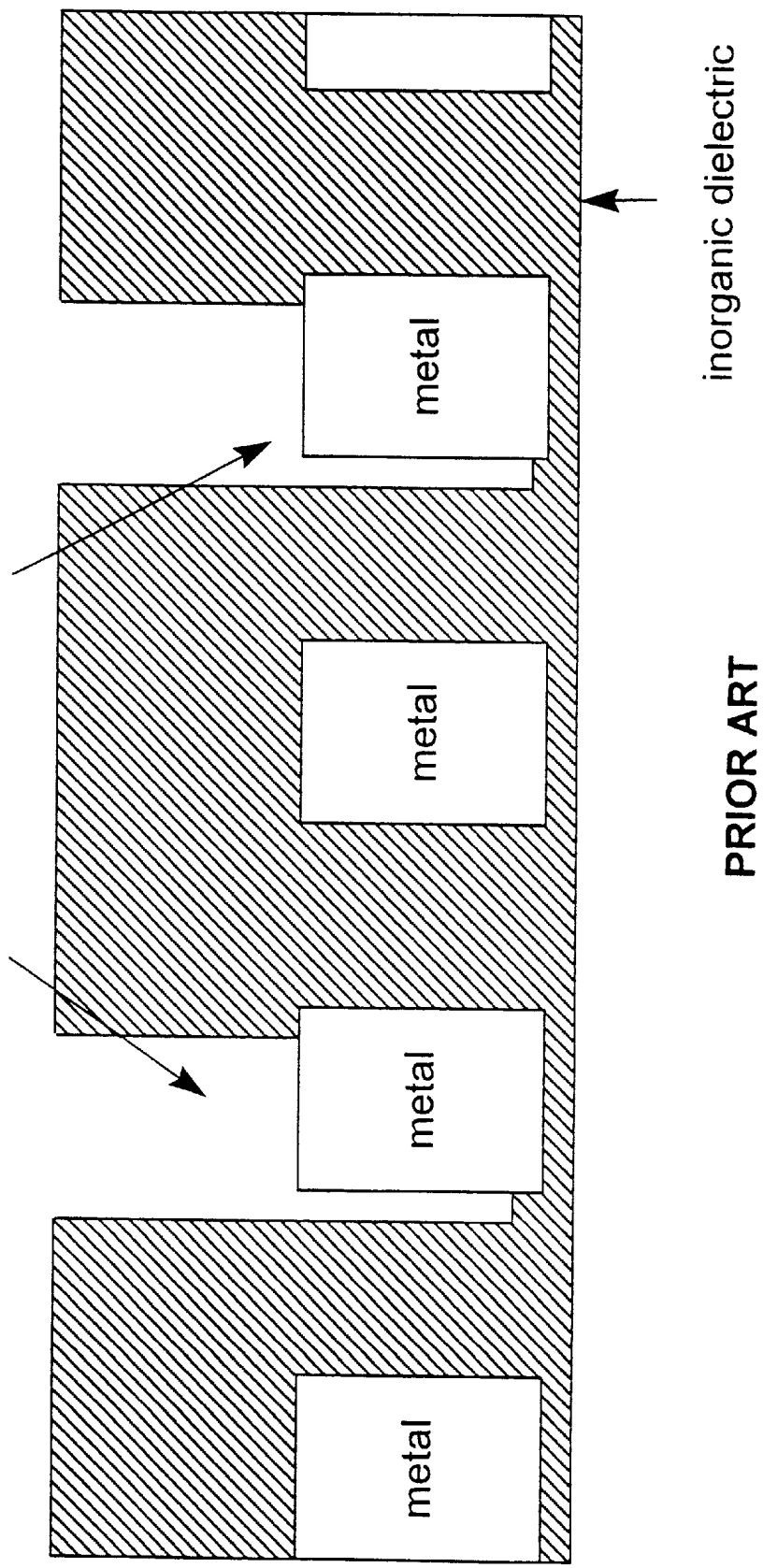

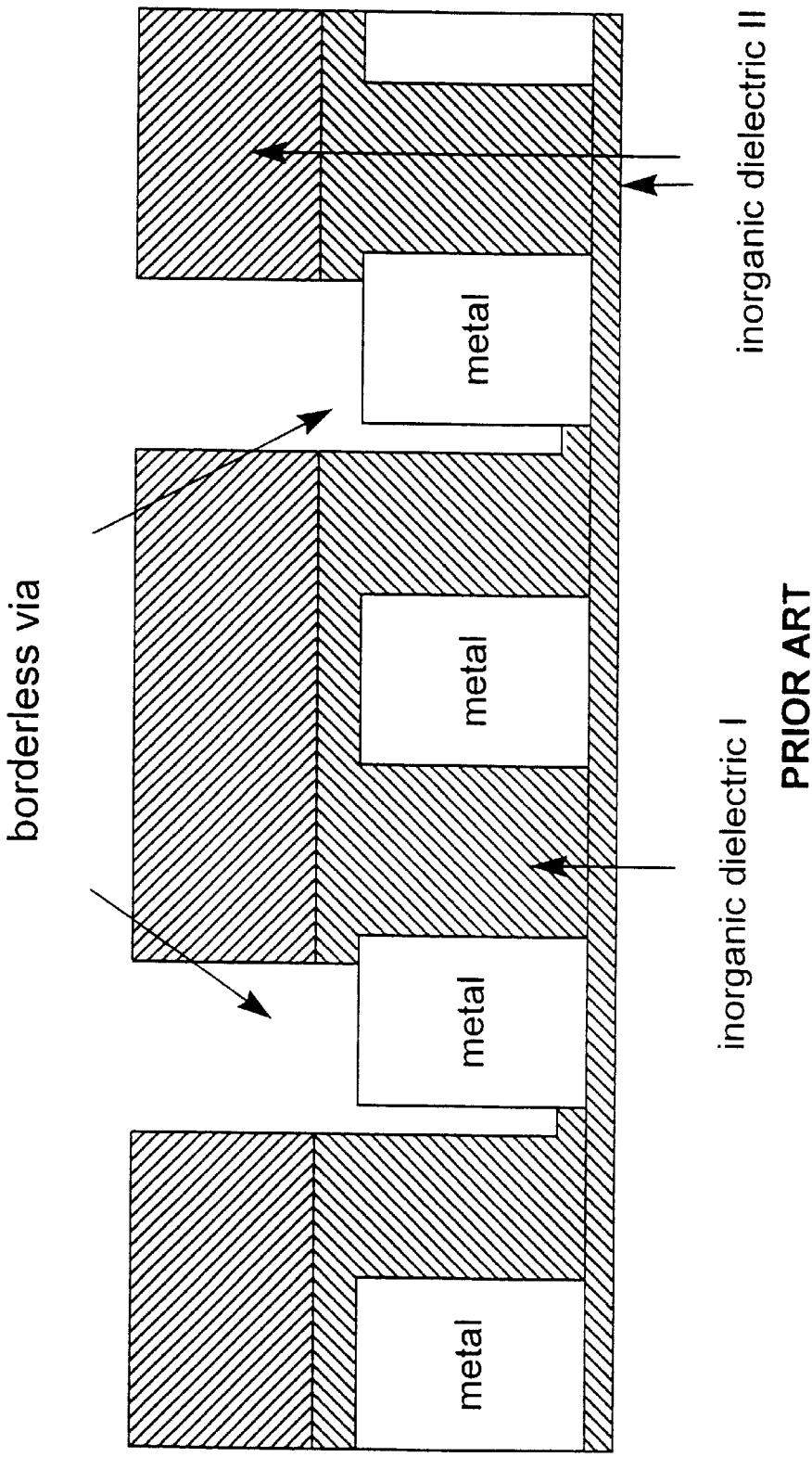

Conventional architecture III
PRIOR ART

New architecture I

New architecture II

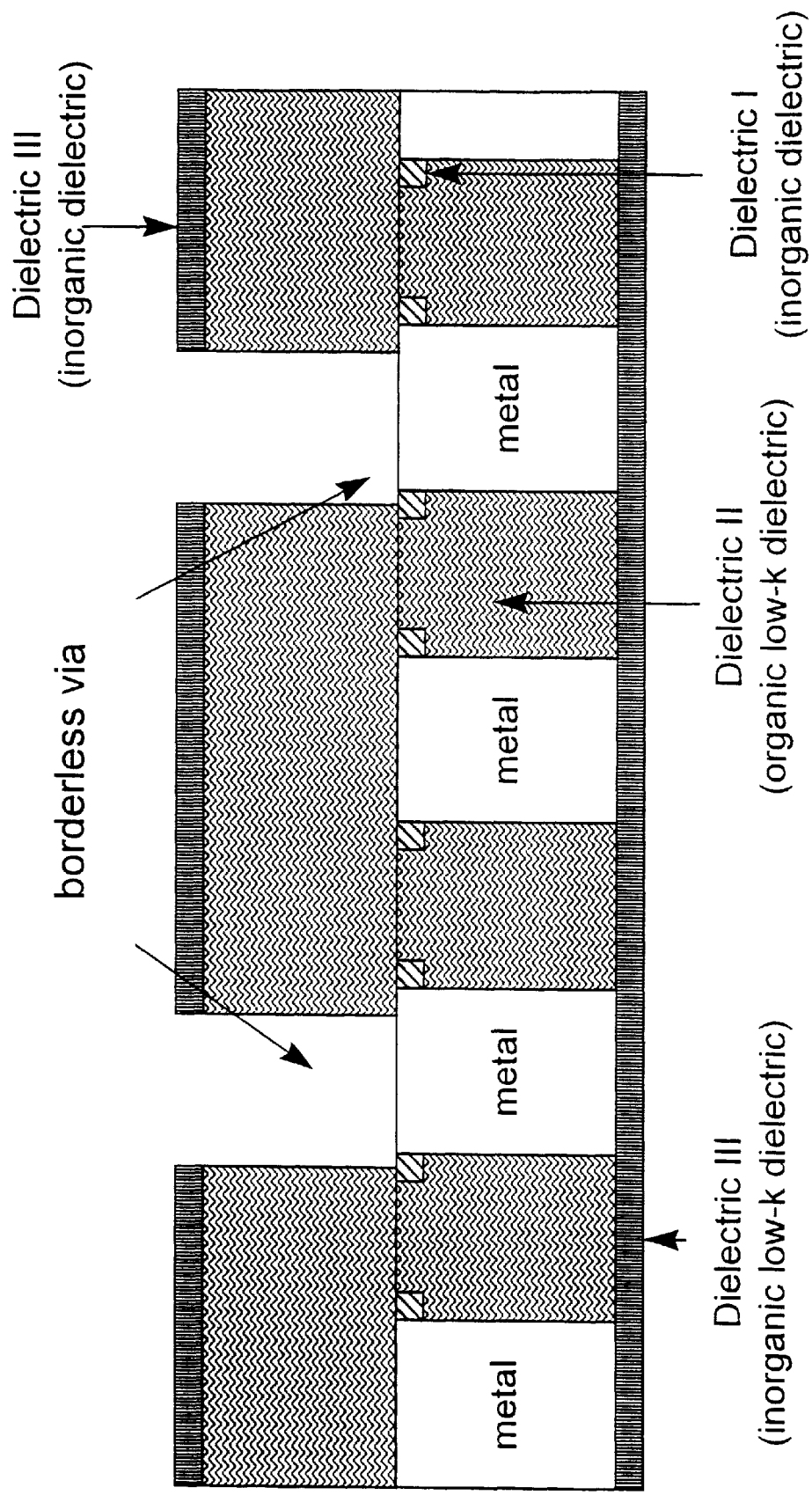

New architecture IV
borderless via

New architecture V
borderless via

New architecture VI
borderless via

After metal patterning

Step 1: Organic low-k dielectric deposition

Step 2: Organic low-k dielectric etchback

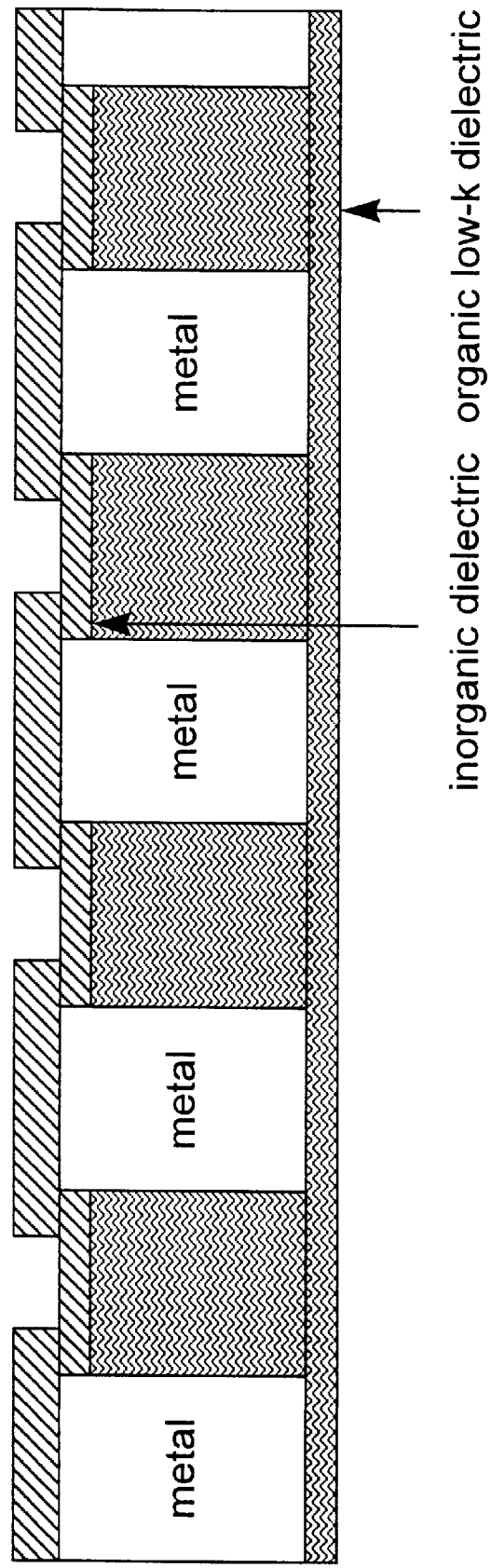

Step 4: Anisotropic inorganic dielectric etchback

Step 5: Organic low-k dielectric deposition
Step 6: Sacrificial metal deposition
Step 7: Resist spin and bake Step 8: Via mask and resist development Step 9: Anisotropic sacrificial metal etch Step 10: Anisotropic organic low-k dielectric etch Step 11: Barrier metal and W depositions Step 12: CMP of W, barrier metal and sacrificial metal Step 4: CMP of inorganic dielectric After metal patterning Step 6: Organic low-k dielectric deposition
Step 7: Inorganic low-k dielectric deposition
Step 8: Resist spin and bake Step 10: Anisotropic inorganic low-k dielectric etch Step 11: Anisotropic organic low-k dielectric etch Step 4: CMP of inorganic dielectric After metal patterning Step 1: Inorganic low-k dielectric deposition Step 2: Inorganic low-k dielectric etchback Step 3: Conformal deposition of organic dielectric Step 4: Organic low-k dielectric etchback Step 5: Inorganic low-k dielectric deposition
Step 6: Sacrificial metal deposition
Step 7: Resist spin and bake Step 8: Via mask and resist development Step 9: Anisotropic sacrificial metal etch Step 10: Resist removal Step 11: Anisotropic inorganic dielectric etch Step 12: barrier metal and W depositions Step 13: CMP of W, barrier metal and sacrificial metal Step 4: CMP of organic dielectric

ADVANCED FABRICATION METHOD OF INTEGRATED CIRCUITS WITH BORDERLESS VIAS AND LOW DIELECTRIC-CONSTANT INTER-METAL DIELECTRICS

BACKGROUND OF THE INVENTION

1. Field of the Invention

The present invention relates to the formation of structures in microelectronic devices such as integrated circuit devices. More particularly, the invention relates to the formation of borderless vias in intermetal dielectrics.

2. Description of the Related Art

As feature sizes in the production of integrated circuits approach 0.25 µm and below, problems of packing density become increasingly difficult to overcome. The formation of borderless vias is one method to reduce metal pitch in and packing density of integrated circuits. However, it is exceedingly difficult to form borderless vias in conventional subtractive interconnect patterning. The major problem is that deep and narrow trenches are produced at the side of metal lines in via etching whenever vias are misaligned to the underlying metal lines. The trench depth is extremely difficult to control since it is common practice to excess plasma etch in via etch to ensure that via holes are completely open. Organic byproducts are produced in dielectric plasma etching when opening via holes. Those byproducts accumulated at the bottom of trenches cannot be effectively removed by oxygen-based plasma or ashing which are commonly used techniques to strip photoresist used in integrated circuit fabrication. Liquid organic chemicals, which are also commonly used to remove organic byproducts, often cause corrosion of metals from which interconnects are made. As a result, via resistance can be very high and, thus, the performance and reliability of integrated circuits degrade. In extreme cases, integrated circuits fail to function when via holes are totally blocked and vias become electrically open.

The cause of the above mentioned issues of conventional architectures is the lack of a etchstop or plasma etch selectivity when opening vias. These occur in different ways. Usually the same kind of inorganic dielectric is typically used for the via-level and metal-level inter-level dielectrics (IMD's). Even when two different kinds of inorganic dielectrics are used, as far as plasma etching for via holes is concerned, the difference between these two kinds of inorganic dielectrics is insignificant. As a result, via etch continues even when via holes are already fully opened as long as there is misalignment between via and the underlying interconnects or metal lines. The use of two different kinds of dielectrics, one inorganic and the other organic, have been used for the metal-level and the via-level IMD's, respectively, in some prior architectures. This architecture does not have the aforesaid disadvantage architectures since there is very high plasma etch selectivity between inorganic and organic dielectrics. However, its weakness is associated with the photoresist, which is commonly used for patterning, a key technique in integrated circuit fabrication. In conventional integration methods, both the photoresist and the organic IMD's are exposed at the completion of via etch. The organic via-level dielectric is attacked, resulting in deep trenches along the side of metal lines when removing the photoresist which is also organic.

According to the invention one ensures that the part of the via-level IMD, which is exposed to via etch plasma due to misalignment between via and metal lines, does not etch or only insignificantly etches in via openings and during resist removal following via etch. The invention provides borderless vias in integrated circuits. Two key elements are the use of dielectrics of significantly dissimilar plasma etch characteristics and that the dielectric immediately over metal lines is different from the dielectric at the sidewall of the metal lines. These objectives are achieved by dividing the metal-level IMD into two parts.

One dielectric forms a ledge between the metal lines and the rest of the metal-level IMD between the ledge and the metal lines is another dielectric. The two dielectrics are significantly different from each other in their plasma etch characteristics. One dielectric deposits on the sidewall of the metal lines in integrated circuit fabrication. Therefore, the dielectric immediately over metal lines needs to be selectively removed. One common technique is anisotropic plasma etchback. The timed etchback removes a certain amount of dielectric in the direction of plasma etching, which is perpendicular to the wafer in plasma etcher. There is only dielectric on the sidewall of metal lines at the completion of this etchback. In practice, a slightly excessive etch is executed to ensure that no Dielectric I is over metal lines and, thus, the surface of Dielectric I will be slightly below the top of metal lines. Dielectric over metal lines can alternatively be removed by chemical mechanical polishing (CMP), which removes only the dielectric over high-lying regions, the top of metal lines in this case. Metallic thin films can also be used for etchstop in via etch. However, metallic thin films cannot be left at the bottom of the gap between metal lines. Therefore, anisotropic etchback technique is used. The second objective can be achieved by adding a hardmask layer in between the resist and the organic dielectric for the via-level IMD so that either resist or the organic dielectric can be selectively removed. A hardmask is also necessary when the via-level IMD is inorganic and the etchstop, at the sidewall of metal lines, in via etch is organic. The hardmask can be either permanent or sacrificial. Dielectrics of low dielectric constant, k, value are used to minimize the inter-level and intra-level capacitances. Performance enhancement of integrated circuits is achieved with the implementation of new architectures according to this invention in conjunction with the use of dielectrics of low dielectric constant.

SUMMARY OF THE INVENTION

The invention provides an integrated circuit structure which comprises
 (a) a substrate;
 (b) a layer of a second dielectric material positioned on the substrate;
 (c) a plurality of spaced apart metal contacts on the layer of the second dielectric material, which metal contacts have side walls;
 (d) a space between adjacent metal contact side walls, each space being filled with the second dielectric material;
 (e) at least one ledge of a first dielectric material on top of at least one second dielectric material filled space and which ledge is attached to adjacent side walls such that each ledge either
  i) fully spans the width of the filled space between adjacent side walls; or
  ii) partially spans the width of the filled space between adjacent side walls, and the area between adjacent ledges is filled with second dielectric material; a top surface of each of the metal contacts, a top surface of the ledges and a top surface of any filled areas between adjacent ledges being at a common level;

(f) an additional layer of the second dielectric material on at least some of the metal contacts, at least one of the ledges and optionally the filled areas between adjacent ledges;

(g) at least one via extending through the additional layer of the second dielectric material and extending to the top surface of at least one metal contact and optionally at least one of the ledges;

wherein the first dielectric material and the second dielectric material have substantially different etch resistance properties.

The invention also provides an integrated circuit structure which comprises (a) a substrate;

(b) a layer of a third dielectric material positioned on the substrate;

(c) a plurality of spaced apart metal contacts on the layer of the third dielectric material, which metal contacts have side walls;

(d) a space between adjacent metal contact side walls, each space being filled with a second dielectric material;

(e) at least one ledge of a first dielectric material on top of each second dielectric material filled space and which ledge is attached to adjacent side walls such that each ledge either
  i) fully spans the width of the filled space between adjacent side walls; or
  ii) partially spans the width of the filled space between adjacent side walls, and the area between adjacent ledges is filled with second dielectric material; a top surface of each of the metal contacts, a top surface of the ledges and a top surface of any filled areas between adjacent ledges being at a common level;

(f) an additional layer of the second dielectric material on at least some of the metal contacts, at least one of the ledges and optionally the filled areas between adjacent ledges;

(g) an additional layer of the third dielectric material on the additional layer of the second dielectric material;

(h) at least one via extending through the additional layer of the second dielectric material and the additional layer of the third dielectric material, and extending to the top surface of at least one metal contact and optionally at least one of the ledges; wherein the first dielectric material and the second dielectric material have substantially different etch resistance properties and wherein the second dielectric material and the third second dielectric material have substantially different etch resistance properties.

The invention further provides a process for producing an integrated circuit structure which comprises (a) providing a substrate;

(b) depositing a layer of an second dielectric material onto the substrate;

(c) forming a pattern of metal contacts on the layer of the second dielectric material;

(d) depositing a layer of the second dielectric material on a top surface of the metal contacts and filling in a space between the metal contacts with second dielectric material on the layer of the second dielectric material;

(e) removing the second dielectric material from the top surface of the metal contacts and removing an upper portion of the second dielectric material from the filled space between the metal contacts to form a recess;

(f) filling the recess by depositing a first dielectric material therein thus forming at least one ledge, wherein the first dielectric material and the second dielectric material have substantially different etch resistance properties;

(g) optionally depositing a patterned layer of the first dielectric material over the metal contacts and over side edges of the ledge but not over a central portion of the ledge; and then removing the first dielectric material from the central portion of the ledge and removing the patterned layer, while leaving the portion of the first dielectric material at side edges of the ledge;

(h) depositing an additional layer of the second dielectric material on the top surface of the metal contacts, and on at least one of the ledges and in any the removed central portion of the ledges;

(i) depositing a layer of a sacrificial metal on the additional layer of the second dielectric material;

(j) depositing a layer of a photoresist on the layer of the sacrificial metal layer;

(k) imagewise removing a portion of the photoresist over at least one metal contact and optionally over at least a portion of the ledge;

(l) removing the portion of the layer of the sacrificial metal under the removed portion of the photoresist;

(m) removing the balance of the photoresist layer, and removing the portion of the additional layer of the second dielectric material under the removed portion of the sacrificial metal layer until at least one metal contact and optionally a ledge is reached thus forming at least one via through the second dielectric material extending to at least one metal contact and optionally a ledge.

The invention still further provides a process for producing an integrated circuit structure which comprises p1 (a) providing a substrate;

(b) depositing a layer of a third dielectric material onto the substrate;

(c) forming a pattern of metal contacts on the layer of the third dielectric material;

(d) depositing a layer of a second dielectric material on a top surface of the metal contacts and filling in a space between the metal contacts with second dielectric material on the layer of the third dielectric material; wherein the second dielectric material and the third dielectric material have substantially different etch resistance properties;

(e) removing the second dielectric material from the top surface of the metal contacts and removing an upper portion of the second dielectric material from the filled space between the metal contacts to form a recess;

(f) filling the recess by depositing a first dielectric material therein thus forming at least one ledge, wherein the first dielectric material and the second dielectric material have substantially different etch resistance properties;

(g) optionally depositing a patterned layer of the first dielectric material over the metal contacts and over side edges of the ledge but not over a central portion of the ledge; and then removing the first dielectric material from the central portion of the ledge and removing the patterned layer, while leaving the portion of the first dielectric material at side edges of the ledge;

(h) depositing an additional layer of the second dielectric material on the top surface of the metal contacts, and on at least one of the ledges and in any the removed central portion of the ledges;

(i) depositing an additional layer of the third dielectric material on the additional layer of the second dielectric material;

(j) depositing a layer of a photoresist on additional layer of the third dielectric material;

(k) imagewise removing a portion of the photoresist over at least one metal contact and optionally over at least a portion of the ledge;

(l) removing the portion of the additional layer of the third dielectric material under the removed portion of the photoresist;

(m) removing the balance of the photoresist layer, and removing the portion of the additional layer of the second dielectric material under the removed portion of the additional layer of the third dielectric material until at least one metal contact and optionally a ledge is reached thus forming at least one via through the second dielectric material extending to at least one metal contact and optionally a ledge.

BRIEF DESCRIPTION OF THE DRAWINGS

FIG. 1A shows a conventional prior art integrated circuit architecture I.

FIG. 1B shows a second conventional prior art integrated circuit architecture II.

FIG. 2C shows a third embodiment of a new integrated circuit architecture III according to the invention.

FIG. 3D shows the formation process resulting after inorganic dielectric deposition.

DETAILED DESCRIPTION OF THE PREFERRED EMBODIMENT

Figure 1C:
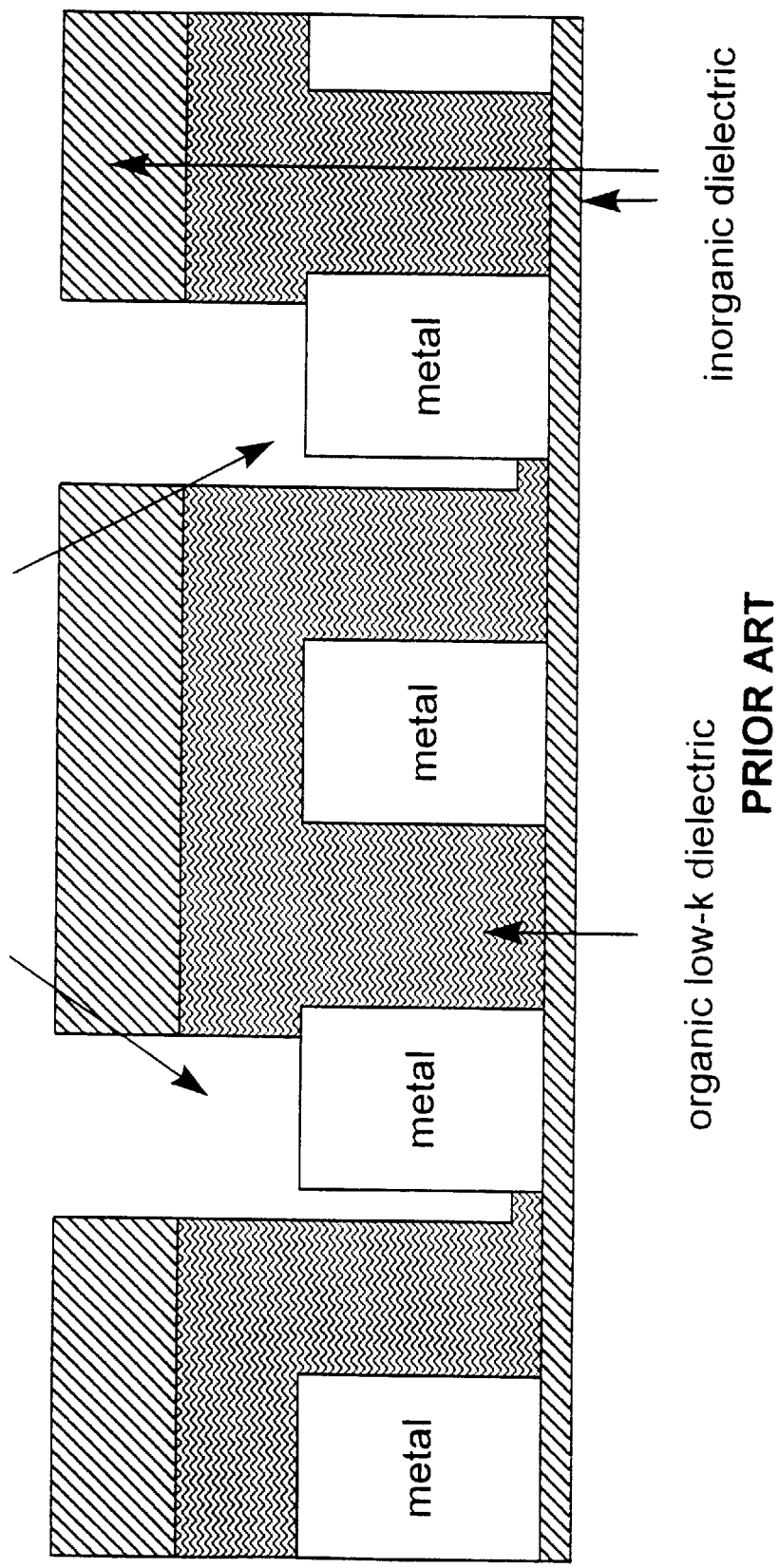
FIG. 1C shows a third conventional prior art integrated circuit architecture III.

FIGS. 1A–C show prior art integrated circuit conventional architectures I, II and III, and illustrate the problem of producing borderless vias. As can be seen, deep and narrow trenches are typically produced at the side of metal lines in via etching whenever vias are misaligned to the underlying metal lines. According to the present invention, a metal level dielectric ledge is formed at the sides of the metal lines, and the area between and above adjacent metal contacts is filled with a different metal level dielectric whose etch resistance properties is significantly different from those of the metal level dielectric ledge. Six architecture embodiments are illustrated in FIGS. 2A through 2F.

Figure 2A:
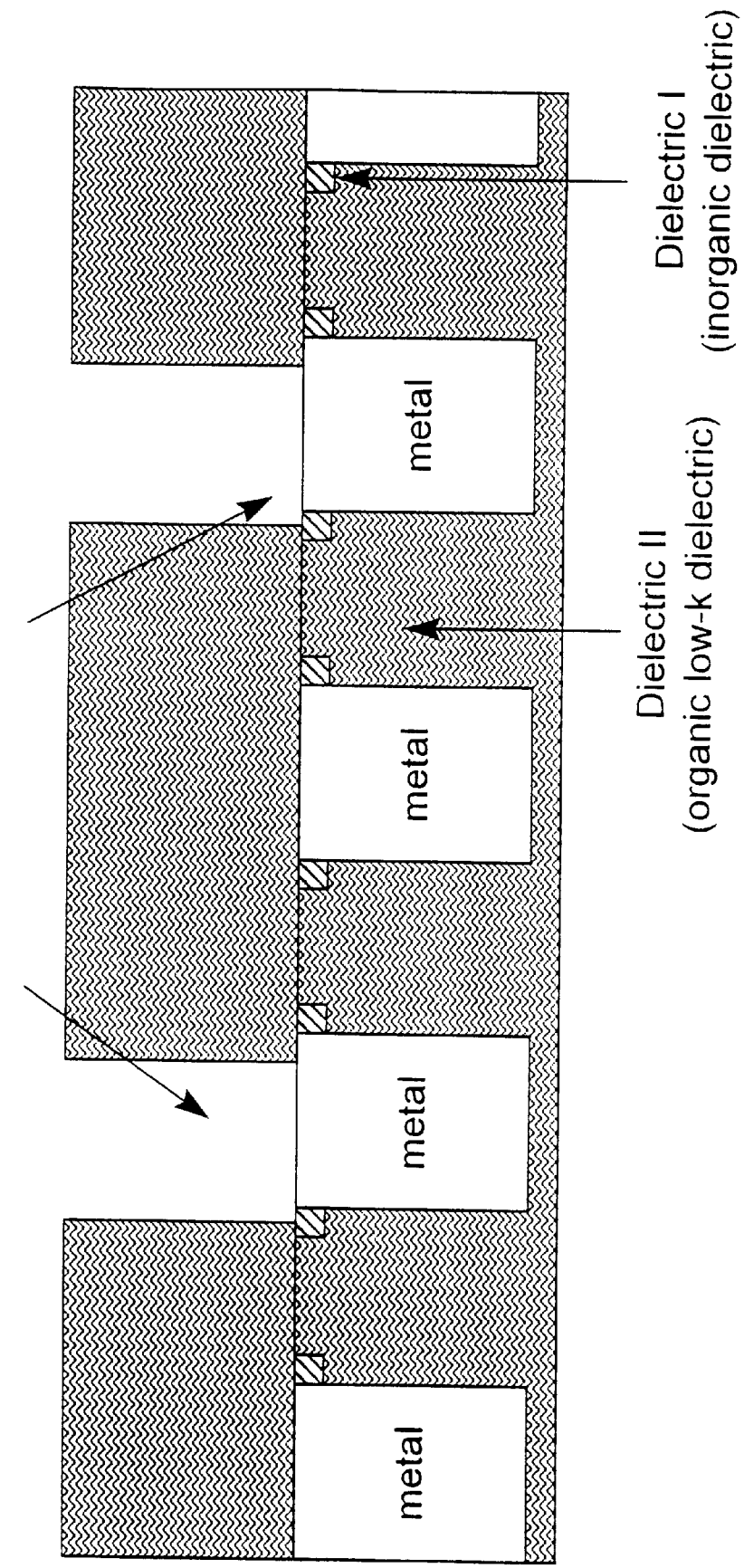
FIG. 2A shows a first embodiment of a new integrated circuit architecture I according to the invention.
Figure 2B:
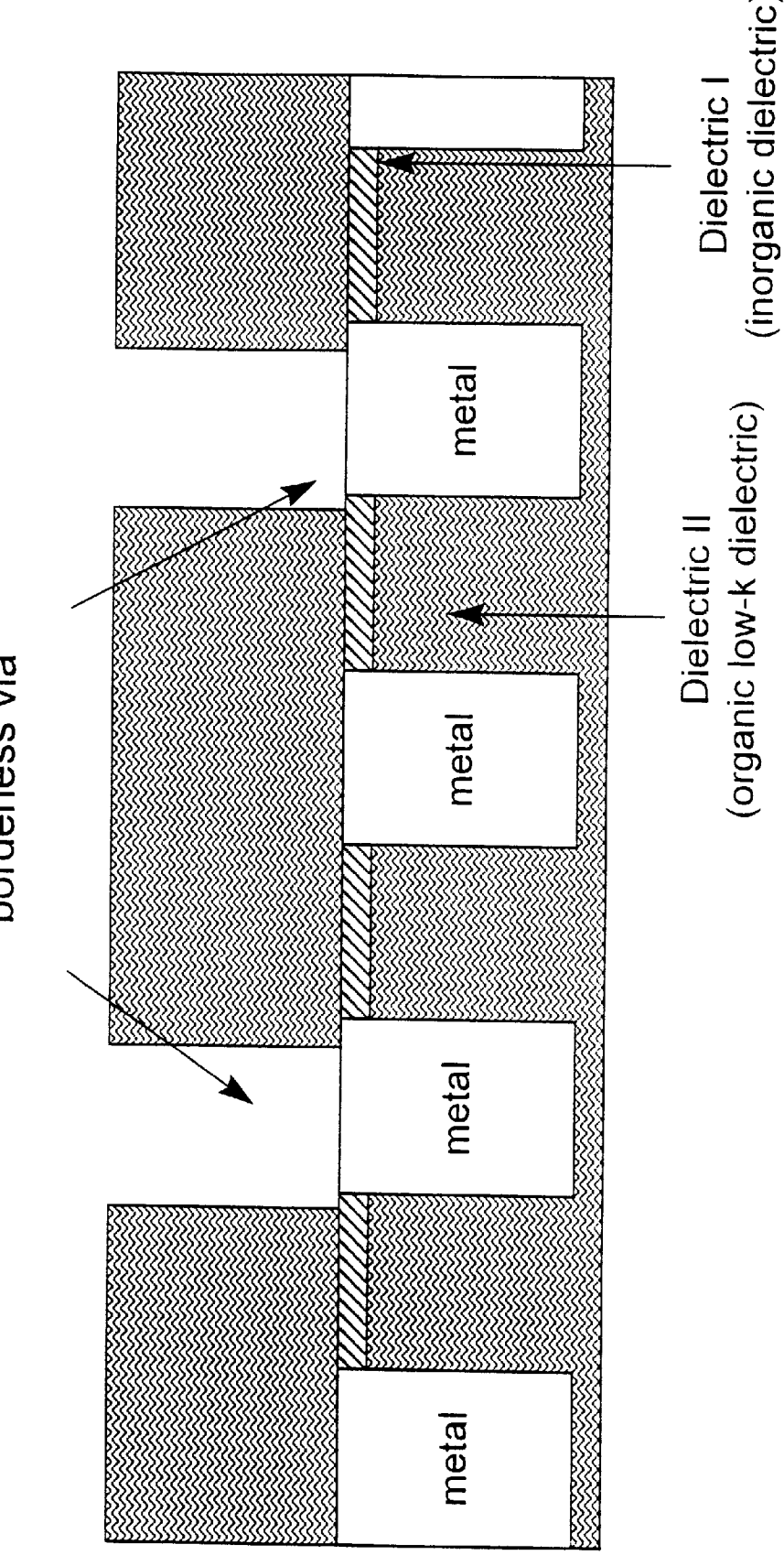
FIG. 2B shows a second embodiment of a new integrated circuit architecture II according to the invention.

The first integrated circuit architecture I according to the invention is show in FIG. 2A. It comprises a base substrate (not shown) and a layer of a second dielectric material (Dielectric II) on the substrate. A plurality of spaced apart metal contacts are on the layer of the second dielectric material. The metal contacts have side walls and a space between adjacent metal contact side walls. Each space is also filled with the second dielectric material except for a least one ledge of a first dielectric material on top of each second dielectric material filled space. It is to be understood that as used in this invention, Dielectric I is substantially different in etch resistance properties from Dielectric II. As described hereinafter Dielectric II is also substantially different in etch resistance properties from a Dielectric III. The ledges are attached to adjacent side walls such that each ledge either partially spans the width of the filled space between adjacent side walls, and then the area between adjacent ledges is filled with second dielectric material, as shown in FIG. 2A; or alternatively the ledges fully span the width of the filled space between adjacent side walls as shown in FIG. 2B. A top surface of each of the metal contacts, a top surface of the ledges and a top surface of any filled areas between adjacent ledges are at a common level as shown. The structure then has an additional layer of the second dielectric material on at least some of the metal contacts and the ledges. Vias are then formed through the additional layer of the second dielectric material until the top surface of the metal contact is reached. In the event that the vias are misaligned, then this misalignment is compensated for by the vias and ledges as seen in FIGS. 2A and 2B. It is important for the invention that the first dielectric material and the second dielectric material have substantially different etch resistance properties. For example, when the first dielectric material is organic then the second dielectric material is inorganic and when the first dielectric material is inorganic then the second dielectric material is organic. The advantage of the invention is a significant difference in plasma etch rate between organic and inorganic dielectrics. This is not possible when the same dielectric is employed for both via-level and metal-level dielectrics. In oxygen-based plasmas, organic dielectrics etch tremendously faster than inorganic dielectrics. Inversely, in carbon fluoride based plasmas, inorganic dielectrics etch much faster than organic dielectrics.

In forming a microelectronic device, vias are filled with a metal to form an electrical connection with the metal contacts. Although this application refers to at least one via, in actuality, there are many vias and all are open to extend down to their underlying metal contacts. The purpose of each via is to extend to the underlying metal contacts, however, the via may touch the ledge on its corresponding contact. The purpose of the ledge is to prevent removal of the dielectric material between contacts in the event the via is misaligned with the metal.

Figure 3A:
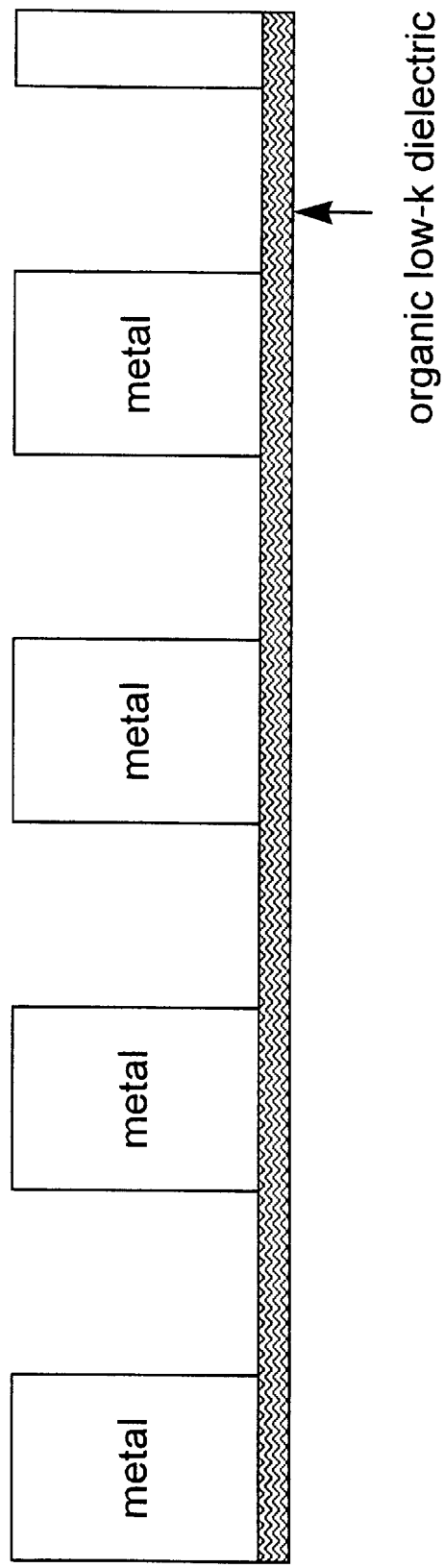
FIG. 3A shows the result of the first step of the formation process for a first embodiment of the invention, architecture I, resulting after metal patterning.

A first process embodiment of the invention for producing new architectures I and II of FIGS. 2A and 2B is exemplified by FIGS. 3A through 3K. These figures show the process flow after the formation of the one interconnect level, however, the same processing steps can be repeated again for upper levels of vias and interconnects. FIG. 3A shows the interim structure at a beginning step which is a deposition of an organic low-k dielectric (Dielectric II) onto a substrate and forming a pattern of metal contacts on the layer of the second dielectric material. Typical substrates include those suitable to be processed into an integrated circuit or other microelectronic device. Suitable substrates for the present invention non-exclusively include semiconductor materials such as gallium arsenide (GaAs), germanium, silicon, silicon germanium, lithium niobate and compositions containing silicon such as crystalline silicon, polysilicon, amorphous silicon, epitaxial silicon, and silicon dioxide ($SiO_2$) and mixtures thereof and may include metal contact lines which are typically formed by well known lithographic techniques. Suitable materials for the metal contacts include aluminum, aluminum alloys, copper, copper alloys, titanium, tantalum, and tungsten. These lines form the conductors of an integrated circuit. Such are typically closely separated from one another at distances preferably of from about 20 micrometers or less, more preferably from about 1 micrometer or less, and most preferably of from about 0.05 to about 1 micrometer.

Figure 3B:
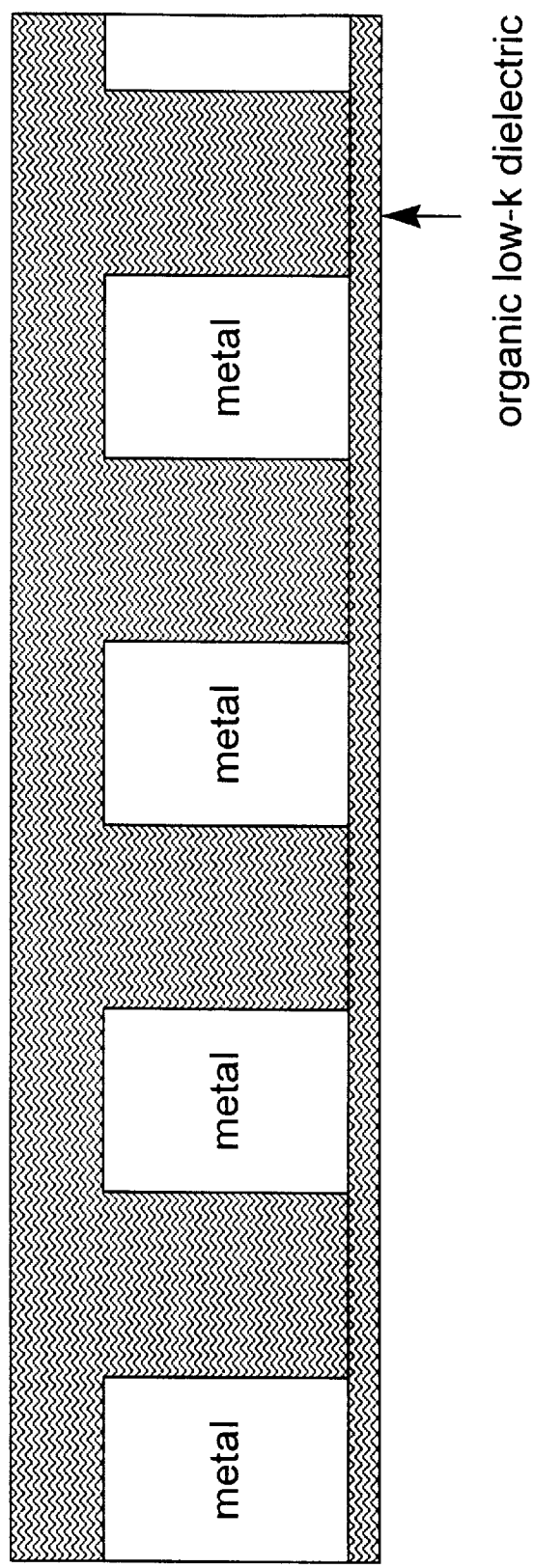
FIG. 3B shows the formation process resulting after deposition of an organic dielectric.

The first process step is to deposit a lining of a second dielectric material (Dielectric II) between the side walls of the metal contacts, as well as on a top surface of the metal contacts as shown in FIG. 3B. Organic and inorganic dielectric compositions may comprise any of a wide variety of dielectric forming materials which are well known in the art for use in the formation of microelectronic devices. The dielectrics may nonexclusively include silicon containing spin-on glasses, i.e. silicon containing polymer such as an alkoxysilane polymer, a silsesquioxane polymer, a siloxane polymer; a poly(arylene ether), a fluorinated poly(arylene ether), other polymeric dielectric materials, nanoporous silica or mixtures thereof. The only criteria for this invention in the various embodiments hereinafter described is that Dielectric I has significantly different etch resistance properties from Dielectric II, and Dielectric II has significantly different etch resistance properties from Dielectric III. Dielectric I may be the same or different from Dielectric III. Useful organic dielectrics are those which follow which are carbon containing and inorganics are those which follow which are not carbon containing.

One useful polymeric dielectric material useful for the invention include an nanoporous silica alkoxysilane polymer formed from an alkoxysilane monomer which has the formula:

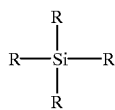

wherein at least 2 of the R groups are independently $C_1$ to $C_4$ alkoxy groups and the balance, if any, are independently selected from the group consisting of hydrogen, alkyl, phenyl, halogen, substituted phenyl. Preferably each R is methoxy, ethoxy or propoxy. Such are commercially available from AlliedSignal as Nanoglass™. The most preferred alkoxysilane monomer is tetraethoxysilane (TEOS). Also useful are hydrogensiloxanes which have the formula $[(HSiO_{1.5})_xO_y]_n$, hydrogensilsesquioxanes which have the formula $(HSiO_{1.5})_n$, and hydroorganosiloxanes which have the formulae $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$. In each of these polymer formulae, x=about 6 to about 20, y=1 to about 3, z=about 6 to about 20, n=1 to about 4,000, and each R is independently H, $C_1$ to $C_8$ alkyl or $C_6$ to $C_{12}$ aryl. The weight average molecular weight may range from about 1,000 to about 220,000. In the preferred embodiment n ranges from about 100 to about 800 yielding a molecular weight of from about 5,000 to about 45,000. More preferably, n ranges from about 250 to about 650 yielding a molecular weight of from about 14,000 to about 36,000. Useful polymers within the context of this invention non-exclusively include hydrogensiloxane, hydrogensilsesquioxane, hydrogenmethylsiloxane, hydrogenethylsiloxane, hydrogenpropylsiloxane, hydrogenbutylsiloxane, hydrogentert-butylsiloxane, hydrogenphenylsiloxane, hydrogenmethylsilsesquioxane, hydrogenethylsilsesquioxane, hydrogenpropylsilsesquioxane, hydrogenbutylsilsesquioxane, hydrogentert-butylsilsesquioxane and hydrogenphenylsilsesquioxane and mixtures thereof. Useful organic polymers include polyimides, fluorinated and nonfluorinated polymers, in particular fluorinated and nonfluorinated poly(arylethers) available under the tradename FLARE™ from AlliedSignal Inc., and copolymer mixtures thereof. The hydroorganosiloxanes, poly(arylene ethers), fluorinated poly(arylene ethers) and mixtures thereof are preferred. Suitable poly(arylene ethers) or fluorinated poly(arylene ethers) are known in the art from U.S. Pat. Nos. 5,155,175; 5,114,780 and 5,115,082. Preferred poly(arylene ethers) and fluorinated poly(arylene ethers) are disclosed in U.S. patent application Ser. No. 08/990,157 filed Dec. 12, 1997 which is incorporated herein by reference. Preferred siloxane materials suitable for use in this invention are commercially available from AlliedSignal Inc. under the tradename Accuglass® T-11, T-12 and T-14. Also useful are methylated siloxane polymers available from AlliedSignal Inc. under the tradenames Purespin™ and Accuspin® T18, T23 and T24.

Preferred silicon containing dielectric resins include polymers having a formula selected from the group consisting of $[(HSiO_{1.5})_xO_y]_n$, $(HSiO_{1.5})_n$, $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$ wherein x=about 6 to about 20, y=1 to about 3, z=about 6 to about 20, n=1 to about 4,000, and each R is independently H, $C_1$ to $C_8$ alkyl or $C_6$ to $C_{12}$ aryl which are disclosed in U.S. patent application Ser. No. 08/955,802 filed Oct. 22, 1997 and which is incorporated herein by reference. Also preferred are certain low organic content silicon containing polymers such as those having the formula I:

[H—SiO$_{1.5}$]$_n$[R—SiO$_{1.5}$]$_m$,

[H$_{0.4-1.0}$SiO$_{1.5-1.8}$]$_n$[R$_{0.4-1.0}$—SiO$_{1.5-1.8}$]$_m$,

[H$_{0-1.0}$SiO$_{1.5-2.0}$]$_n$[R—SiO$_{1.5}$]$_m$,

[H—SiO$_{1.5}$]$_x$[R—SiO$_{1.5}$]$_y$[SiO$_2$]$_x$, wherein the sum of n and m, or the sum or x, y and z is from about 8 to about 5000, and m and y are selected such that carbon containing substituents are present in an amount of less than about 40 Mole percent. Polymers having the structure I are of low organic content where the carbon containing substituents are present in an amount of less than about 40 mole percent. These polymers are described more fully in U.S. patent application Ser. No. 09/044,831, filed Mar. 20, 1998, which is incorporated herein by reference. Also preferred are certain high organic content silicon containing polymers such as those having the formula II:

[HSiO$_{1.5}$]$_n$[RSiO$_{1.5}$]$_m$,

[H$_{0.4-1.0}$SiO$_{1.5-1.8}$]$_n$[R$_{0.4-1.0}$SiO$_{1.5-1.8}$]$_m$,

[H$_{0-1.0}$SiO$_{1.5-2.0}$]$_n$[RSiO$_{1.5}$]$_m$, wherein the sum of n and m is from about 8 to about 5000 and m is selected such that the carbon containing substituent is present in an amount of from about 40 Mole percent or greater; and

[HSiO$_{1.5}$]$_x$[RSiO$_{1.5}$]$_y$[SiO$_2$]$_z$;

wherein the sum of x, y and z is from about 8 to about 5000 and y is selected such that the carbon containing substituent is present in an amount of about 40 Mole % or greater; and wherein R is selected from substituted and unsubstituted straight chain and branched alkyl groups, cycloalkyl groups, substituted and unsubstituted aryl groups, and mixtures thereof. The specific mole percent of carbon containing substituents is a function of the ratio of the amounts of starting materials. Polymers having the structure II which are of high organic content where the carbon containing substituents are present in an amount of about 40 mole percent or more. These polymers are described more fully in U.S. patent application Ser. No. 09/044,798, filed Mar. 20, 1998, which is incorporated herein by reference.

The polymer may be present in the dielectric composition in a pure or neat state (not mixed with any solvents) or it may be present in a solution where it is mixed with solvents. When solvents are present, the polymer is preferably present in an amount of from about 1% to about 50% by weight of the polymer, more preferably from about 3% to about 20%. The solvent component is preferably present in an amount of from about 50% to about 99% by weight of the dielectric composition, more preferably from about 80% to about 97%. Suitable solvents nonexclusively include aprotic solvents such as cyclic ketones including cyclopentanone, cyclohexanone, cyclohexanone and cyclooctanone; cyclic amides such as N-alkylpyrrolidinone wherein the alkyl group has from 1 to about 4 carbon atoms, and N-cyclohexyl-pyrrolidinone, and mixtures thereof Deposition of the dielectric onto the substrate may be conducted via conventional spin-coating, dip coating, roller coating, spraying, chemical vapor deposition methods, or meniscus coating methods which are well-known in the art. Spin coating is most preferred. The thickness of the dielectric layers may vary depending on the deposition procedure and parameter setup, but typically the thickness may range from about 500 Å to about 50,000 Å, and preferably from about 2000 Å to about 12000 Å. In the preferred embodiment, a liquid dielectric composition is spun onto the appropriate surface according to known spin techniques such as by applying a liquid dielectric composition to the surface and then spinning on a rotating wheel at speeds ranging from about 500 to about 6000 rpm for about 5 to about 60 seconds. The layer preferably has a density of from about 1 g/cm$^3$ to about 3 g/cm$^3$.

The dielectric on the metal contacts may be conformal deposited using chemical vapor deposition techniques. The as-deposited thickness of the dielectric is required to be that its thickness on the sidewall of metal lines is no less than the allowable misalignment between the subsequently printed via and the metal lines underneath it. On the other hand, the dielectric needs be kept thin enough so that no keyholes are formed in it.

The dielectrics may optionally be heated to expel residual solvent or to increase its molecular weight. The heating may be conducted by conventional means such as heating on a hot plate in air or in an inert atmosphere, or it may occur in a furnace or oven in air, or in an inert atmosphere, or it may occur in a vacuum furnace or vacuum oven. Heating is preferably conducted at a temperature of from about 80° C. to about 500° C., and more preferably from about 150° C. to about 425° C. This heating is preferably performed from about 1 minute to about 360 minutes, and more preferably from about 2 to about 60 minutes. The dielectric layer may also optionally be exposed to actinic light, such as UV light, to increase its molecular weight. The amount of exposure may range from about 100 mJ/cm$^2$ to about 300 mJ/cm$^2$. The dielectric layers may optionally be cured by overall exposed to electron beam radiation. Electron beam exposure may be controlled by setting the beam acceleration. Electron beam radiation may take place in any chamber having a means for providing electron beam radiation to substrates placed therein. It is preferred that the electron beam exposing step is conducted with a wide, large beam of electron radiation from a large-area electron beam source. Preferably, an electron beam chamber is used which provides a large area electron source. Suitable electron beam chambers are commercially available from Electron Vision, a unit of Allied-Signal Inc., under the trade name "ElectronCure™". The principles of operation and performance characteristics of such device are described in U.S. Pat. No. 5,003,178, the disclosure of which is incorporated herein by reference. The temperature of the electron beam exposure preferably ranges from about 20° C. to about 450° C., more preferably from about 50° C. to about 400° C. and most preferably from about 200° C. to about 400° C. The electron beam energy is preferably from about 0.5 KeV to about 30 KeV, and more preferably from about 3 to about 10 KeV. The dose of electrons is preferably from about 1 to about 50,000 $\mu$C/cm$^2$ and more preferably from about 50 to about 20,000 $\mu$C/cm$^2$. The gas ambient in the electron beam tool can be any of the following gases: nitrogen, oxygen, hydrogen, argon, a blend of hydrogen and nitrogen, ammonia, xenon or any combination of these gases. The electron beam current is preferably from about 1 to about 40 mA, and more preferably from about 5 to about 20 mA. Preferably, the electron beam exposing step is conducted with a wide, large beam of electron beam radiation from a uniform large-are electron beam source which covers an area of from about 4 inches to about 256 square inches.

Figure 3C:
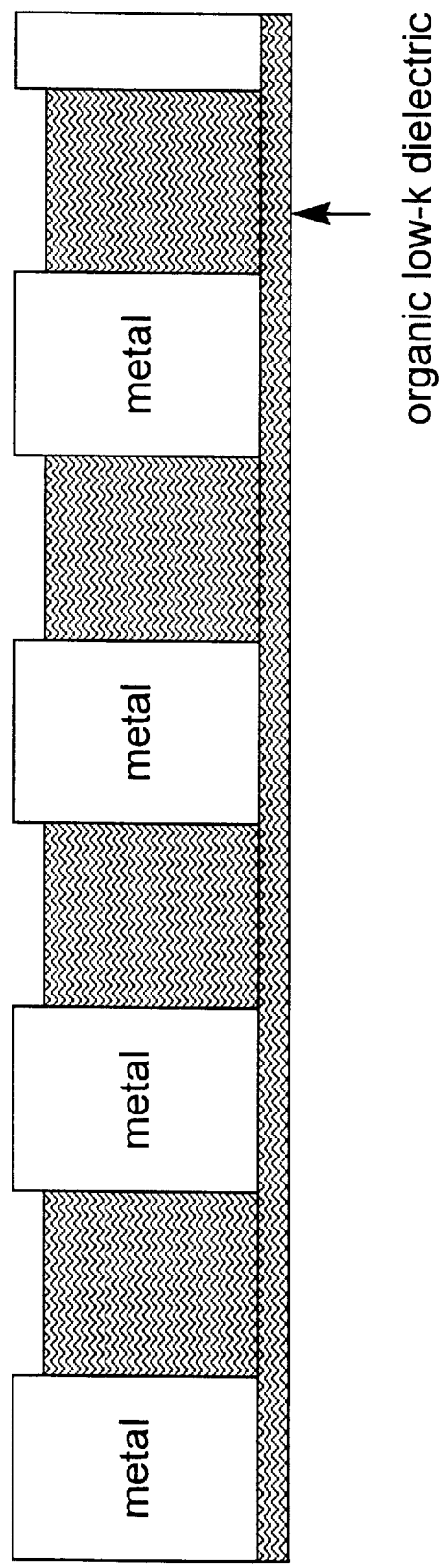
FIG. 3C shows the formation process resulting after organic dielectric etchback.

The next step 2 is removing the second dielectric material from the top surface of the metal contacts and forming a recess in the space between adjacent side walls of the metal contacts as shown in FIG. 3C. This is done by etchback. The etchback needs to be well-controlled to minimize the recess produced by it. The etchback can be performed in fluorine-based plasma chemistry. In step 3 one then deposits a layer of a first dielectric material (Dielectric I) in the recess and on the top surface of the metal contacts.

Figure 3E:
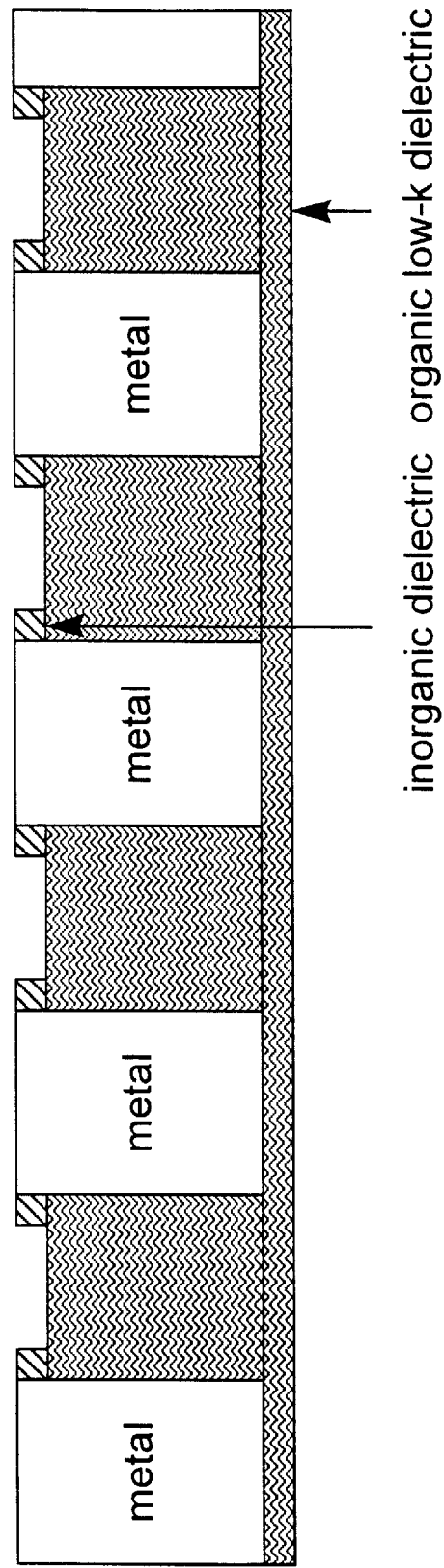
FIG. 3E shows the formation process resulting after anisotropic inorganic dielectric etchback.
Figure 3F:
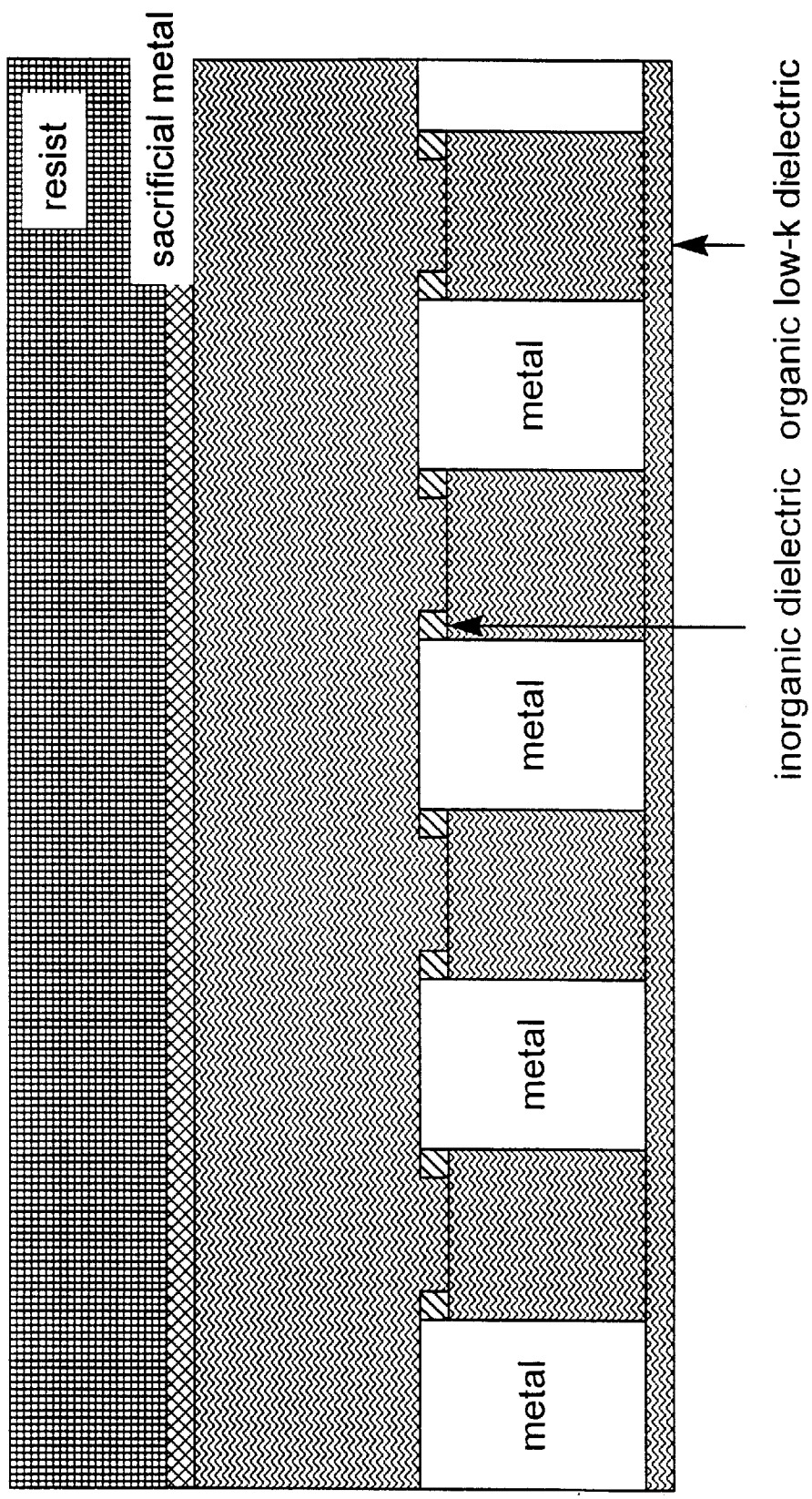
FIG. 3F shows the formation process resulting after organic dielectric deposition, sacrificial metal deposition and resist application.
Figure 3G:
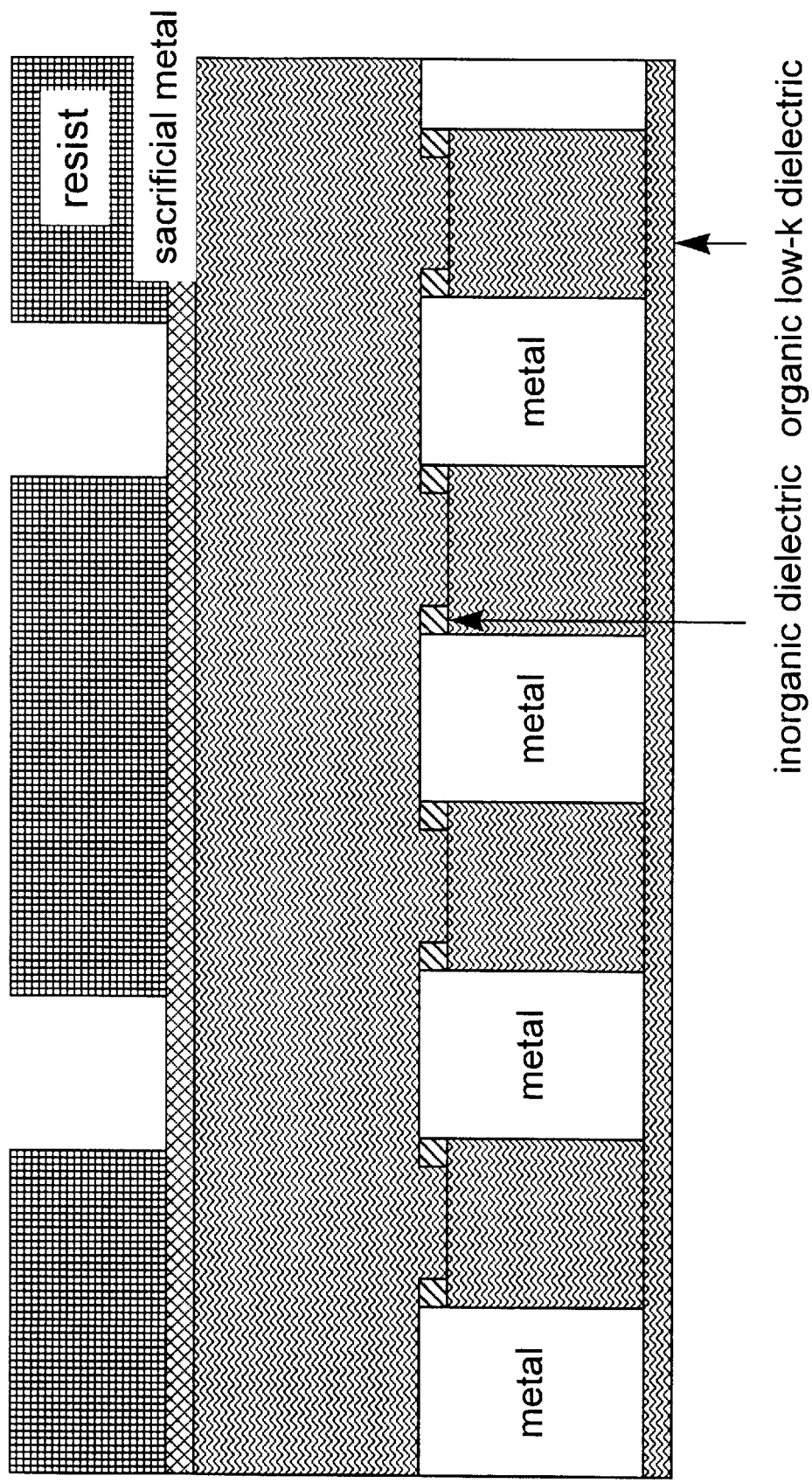
FIG. 3G shows the formation process resulting after resist patterning and development.
Figure 3H:
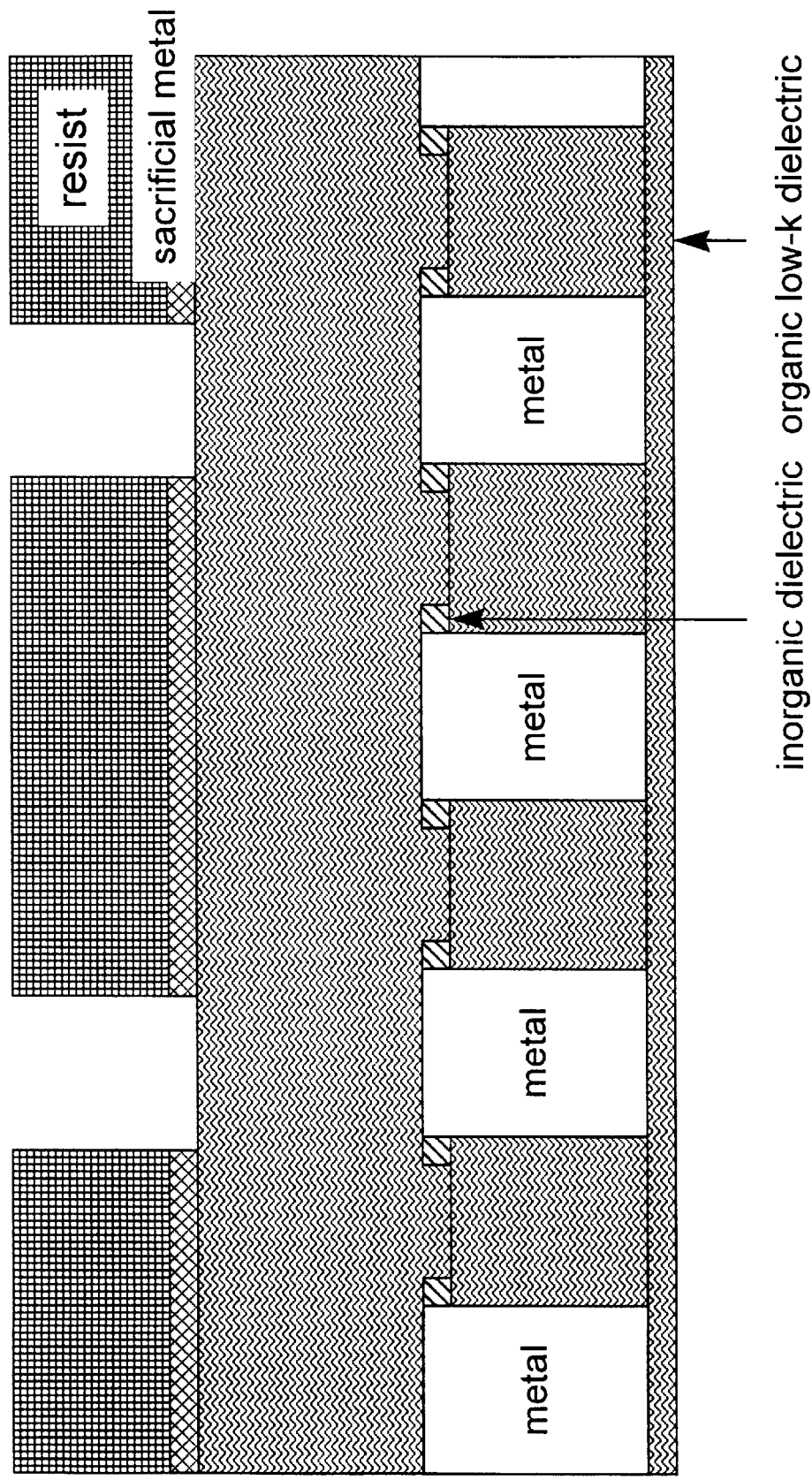
FIG. 3H shows the formation process resulting after sacrificial metal etch.
Figure 3I:
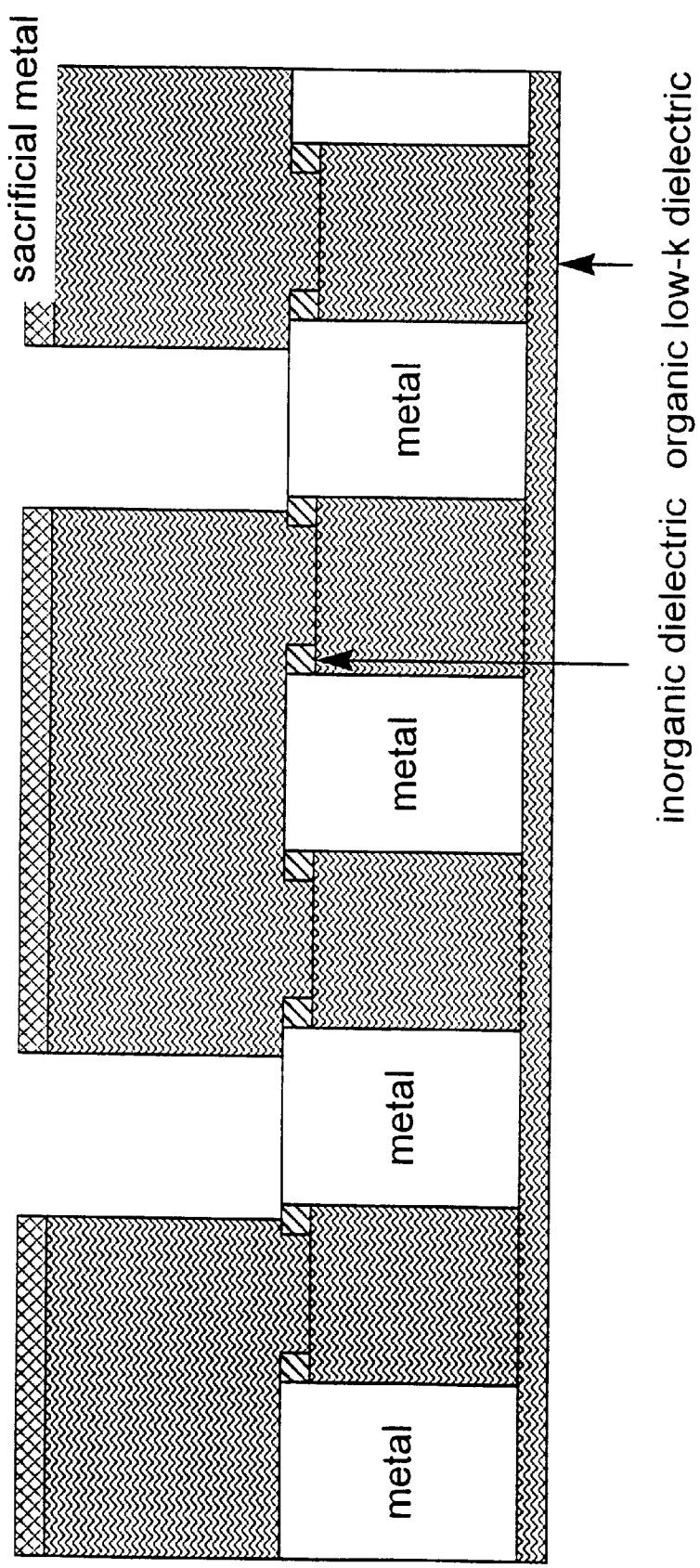
FIG. 3I shows the formation process resulting after anisotropic organic dielectric etching.
Figure 3J:
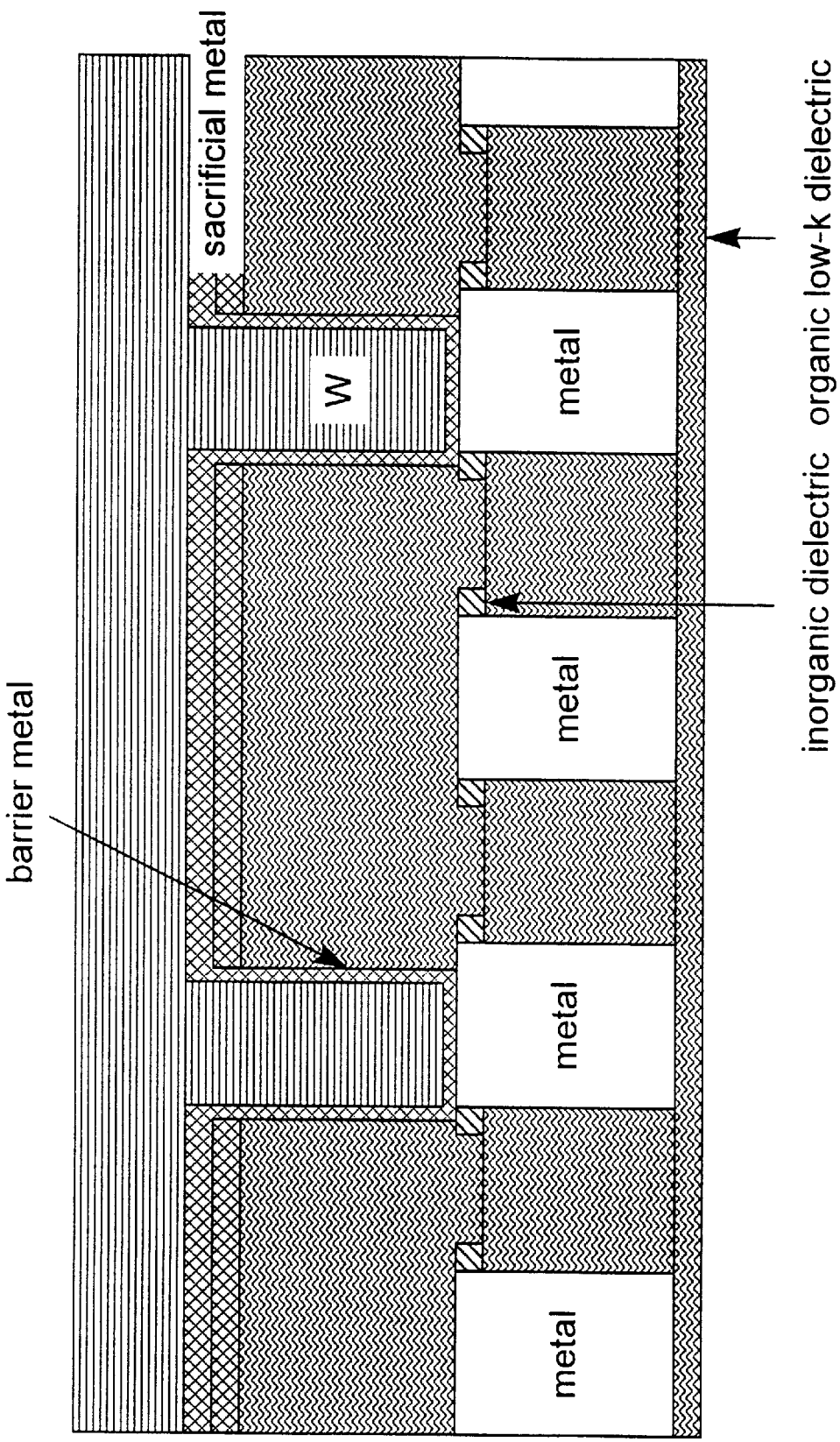
FIG. 3J shows the formation process resulting after barrier metal and tungsten depositions.
Figure 3K:
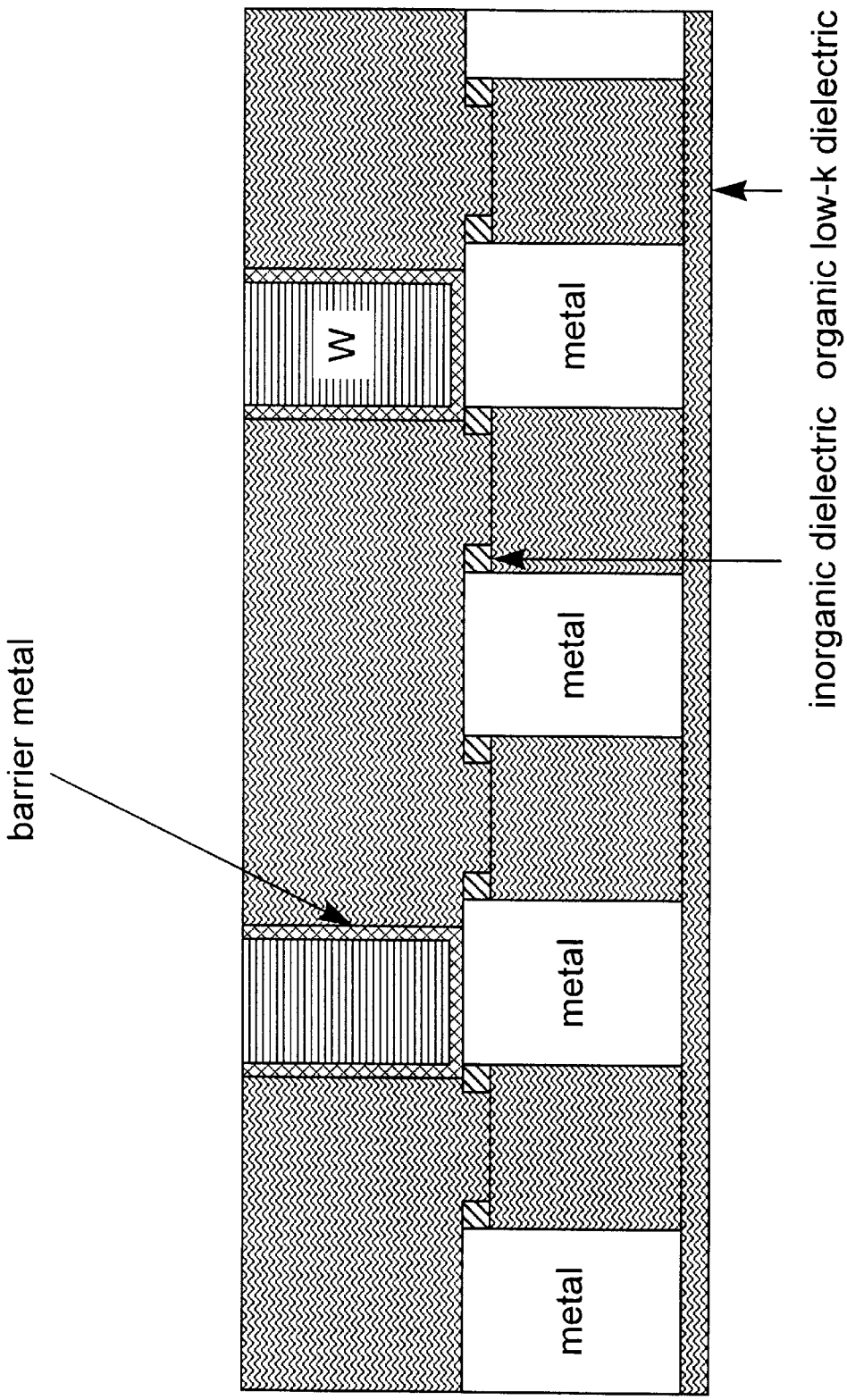
FIG. 3K shows the formation process resulting after removal of the barrier metal, sacrificial metal layer and excess and tungsten.
Figure 4:
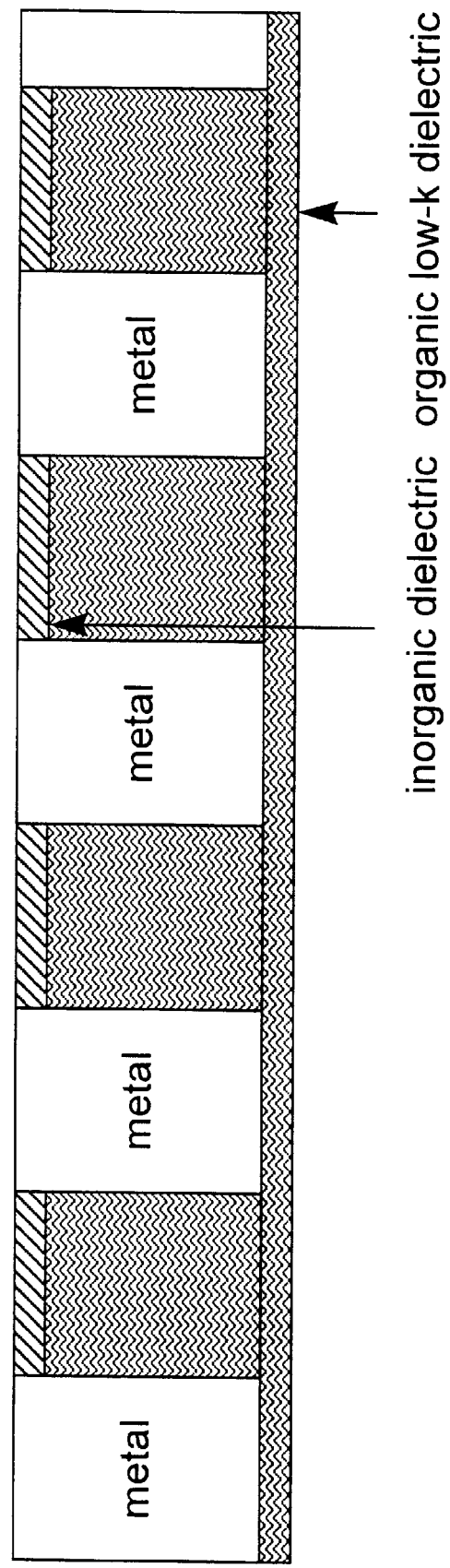
FIG. 4 shows a formation process step for a second embodiment of the invention, architecture II resulting after chemical mechanical polishing of the inorganic dielectric. Prior steps are analogous to FIGS. 3A–3D and subsequent steps are analogous to FIGS. 3F–3J.

The recess is then filled by depositing a first dielectric material therein thus forming ledges. In a first embodiment of the invention according to new architecture I of FIG. 2A, the ledges partially span the width of the filled space between adjacent side walls, as seen in FIG. 3E, and then area between adjacent ledges is filled with the second dielectric material. In a second embodiment of the invention according to new architecture II of FIG. 2B, the ledge spans the distance between adjacent metal contacts as may also be seen in FIG. 4. In order to form this second embodiment, one performs step 3 by depositing a conformal layer of the first dielectric material over the metal contacts and over side edges of the ledges but not over a central portion of the ledges as seen in FIG. 3D. In step 4 one then removes the first dielectric material from the central portion of the ledges while leaving the portion of the first dielectric material at side edges of the ledges as seen in FIG. 3E. This is done by anisotropic etchback. In step 5 one depositing an additional layer of the second dielectric material on the top surface of the metal contacts, and on the ledges and in any removed central portion of the ledges. For architecture I the second dielectric material is on and between ledges while for architecture II, second dielectric material is only on the ledges. In step 6 one deposits a layer of a sacrificial metal on the additional layer of the second dielectric material. The layer of a sacrificial metal separates the underlying organic dielectric previously deposited from the resist to be spun in the next step. Significantly high etch selectivity can be easily achieved between inorganic dielectrics and metal thin film and between organic dielectrics and metal thin films. The sacrificial metal protects the underlying organic dielectric when resist is removed after the completion of opening via. Any suitable etchable metal may be used for this layer such as titanium nitride or tungsten. In step 7 one deposits a layer of a photoresist on the layer of the sacrificial metal layer to thereby produce the structure of FIG. 3F. The layer of a photoresist is then applied and baked on the layer of the sacrificial metal layer. The photoresist composition may be positive working or negative working and are generally commercially available. Suitable positive working photoresists are well known in the art and may comprise an o-quinone diazide radiation sensitizer. The o-quinone diazide sensitizers include the o-quinone-4-or-5-sulfonyl-diazides disclosed in U.S. Pat. Nos. 2,797,213; 3,106,465; 3,148,983; 3,130,047; 3,201,329; 3,785,825; and 3,802,885. When o-quinone diazides are used, preferred binding resins include a water insoluble, aqueous alkaline soluble or swellable binding resin, which is preferably a novolak. Suitable positive photodielectric resins may be obtained commercially, for example, under the trade name of AZ-P4620 from Clariant Corporation of Somerville, N.J. After imagewise removing a portion of the photoresist over at least one metal contact and optionally over at least a portion of the ledges in step 8, the structure of FIG. 3G is attained. Such is performed in a manner well known in the art such as by imagewise exposing the photoresist to actinic radiation such as through a suitable mask and developing the photoresist. The photoresist may be imagewise exposed to actinic radiation such as light in the visible, ultraviolet or infrared regions of the spectrum through a mask, or scanned by an electron beam, ion or neutron beam or X-ray radiation. Actinic radiation may be in the form of incoherent light or coherent light, for example, light from a laser. The photoresist is then imagewise developed using a suitable solvent, such as an aqueous alkaline solution. Optionally the photoresist is heated to cure the image portions thereof and thereafter developed to remove the nonimage portions and define a via mask. After removing the portion of the layer of the sacrificial metal under the removed portion of the photoresist in a step 9, the structure of FIG. 3H is obtained. This is done by anisotropic sacrificial metal etch. The etch, preferably done in chlorine-based plasma chemistry, and stops by itself on reaching the underlying dielectric due to a significantly high etch selectivity between metal and the dielectric. In step 10, one performs an anisotropic organic dielectric etch. The etch of the exposed organic dielectric, in oxygen-based plasma chemistry, stops by itself on reaching on the metal and the inorganic dielectric on the ledges due to a very high etch selectivity between organic dielectric and metal and between organic and inorganic dielectrics. At the completion of this step, via holes are fully opened without deep and narrow trenches produced on the side of metal lines. Furthermore, the sacrificial metal has become redundant and is to be removed later. The resist, being organic, is simultaneously removed and the structure of FIG. 3I is obtained. One then deposits a layer of a barrier metal on the sacrificial metal layer, and on inside walls and a floor of the vias and fills the vias with a fill metal and deposits a layer of a fill metal on the layer of the barrier metal in a step 11 to produce the structure of FIG. 3J. A barrier metal serves to prevent diffusion of the conductive metal into the dielectric layers. The barrier metal may be, for example, Ti or a nitride such TaN or TiN. A barrier metal which is a bilayered film of titanium and TiN can be used. Then the top of the barrier metal layer is covered with a fill metal. At the same time the vias are filled with the fill metal. Suitable fill metals include aluminum, aluminum alloys, copper, copper alloys, tantalum, tungsten, titanium or other metals or mixtures thereof as typically employed in the formation of microelectronic devices. The metals may be applied by such techniques as vapor deposition, sputtering, evaporation and the like. Copper is most preferred. As used herein, the term "a metal" includes amalgams of metals. One then removes the fill metal layer, the barrier metal layer and the sacrificial metal layer to produce the structure of FIG. 3K. The process steps used for the fabrication of the via and metal levels can be repeated again for the upper levels of vias and metals.

Figure 2D:
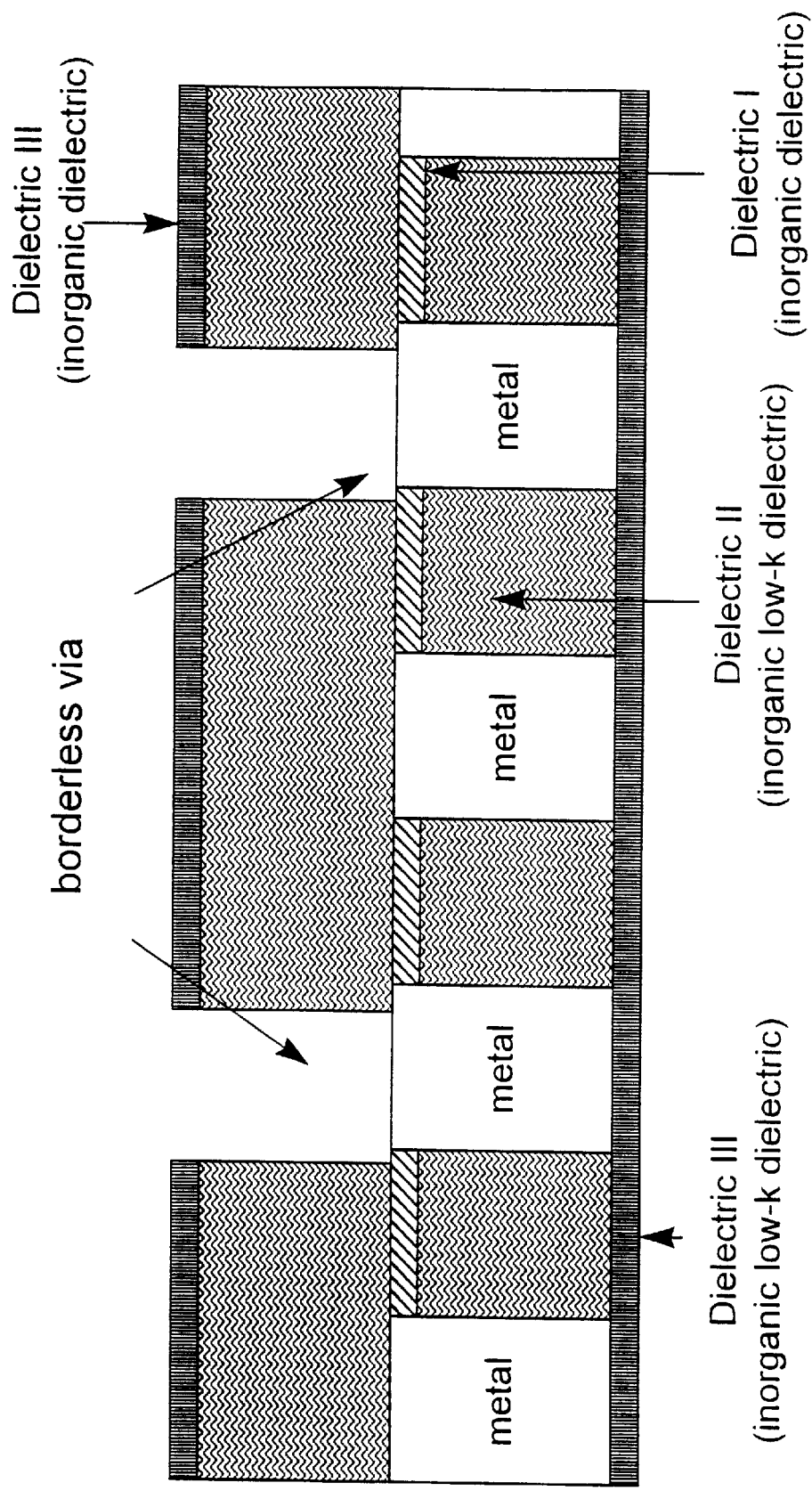
FIG. 2D shows a fourth embodiment of a new integrated circuit architecture IV according to the invention.

A third and fourth embodiment of the invention produces new architectures III and IV as shown in FIGS. 2C and 2D. Wherein three dielectrics are used, namely, Dielectric I, Dielectric II and Dielectric III. These may be selected from the dielectric materials enumerated above, however, Dielectrics I and III and must be significantly different in etch resistance properties from Dielectric II. For example, when Dielectrics I and III are organic, then Dielectric II is inorganic and when Dielectrics I and III are inorganic, then Dielectric II is organic. Although Dielectrics I and III are of the same class, they need not be identical materials.

Architecture III as shown in FIG. 2C comprises a substrate (not shown) and a layer of a third dielectric material (Dielectric III) positioned on the substrate. It has several spaced apart metal contacts having side walls, on the layer of the third dielectric material. A space between adjacent metal contact side walls is filled with a second dielectric material. A ledge of a first dielectric material is on top of each second dielectric material filled space and is attached to adjacent side walls such that each ledge either fully spans the width of the filled space between adjacent side walls as seen in FIG. 2D, or partially spans the width of the filled space between adjacent side walls, and the area between adjacent ledges is filled with second dielectric material as seen in FIG. 2C. A top surface of each of the metal contacts, a top surface of the ledges and a top surface of any filled areas between adjacent ledges are at a common level. An additional layer of the second dielectric material is on the metal contacts, the ledges and in any filled areas between adjacent ledges. An additional layer of the third dielectric material is on the additional layer of the second dielectric material. Vias are formed through the additional layer of the second dielectric material and the additional layer of the third dielectric material, and extend to the top surface of the metal contacts and optionally the ledges.

Figure 5A:
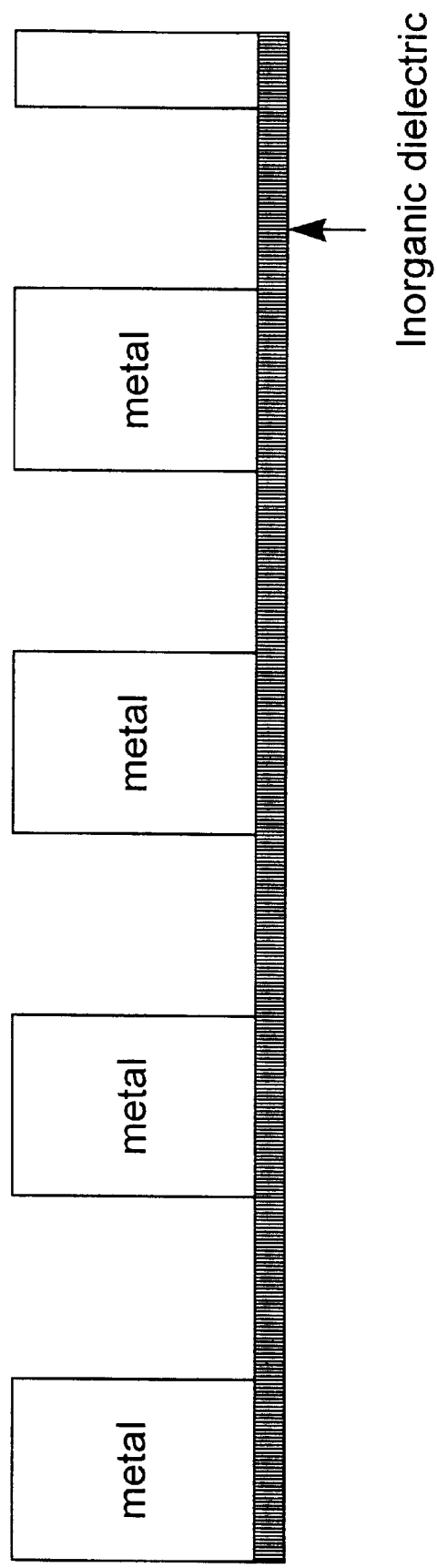
FIG. 5A shows the result of the first step of the formation process for a third embodiment of the invention, architecture III of FIG. 2C resulting after metal patterning.
Figure 5B:
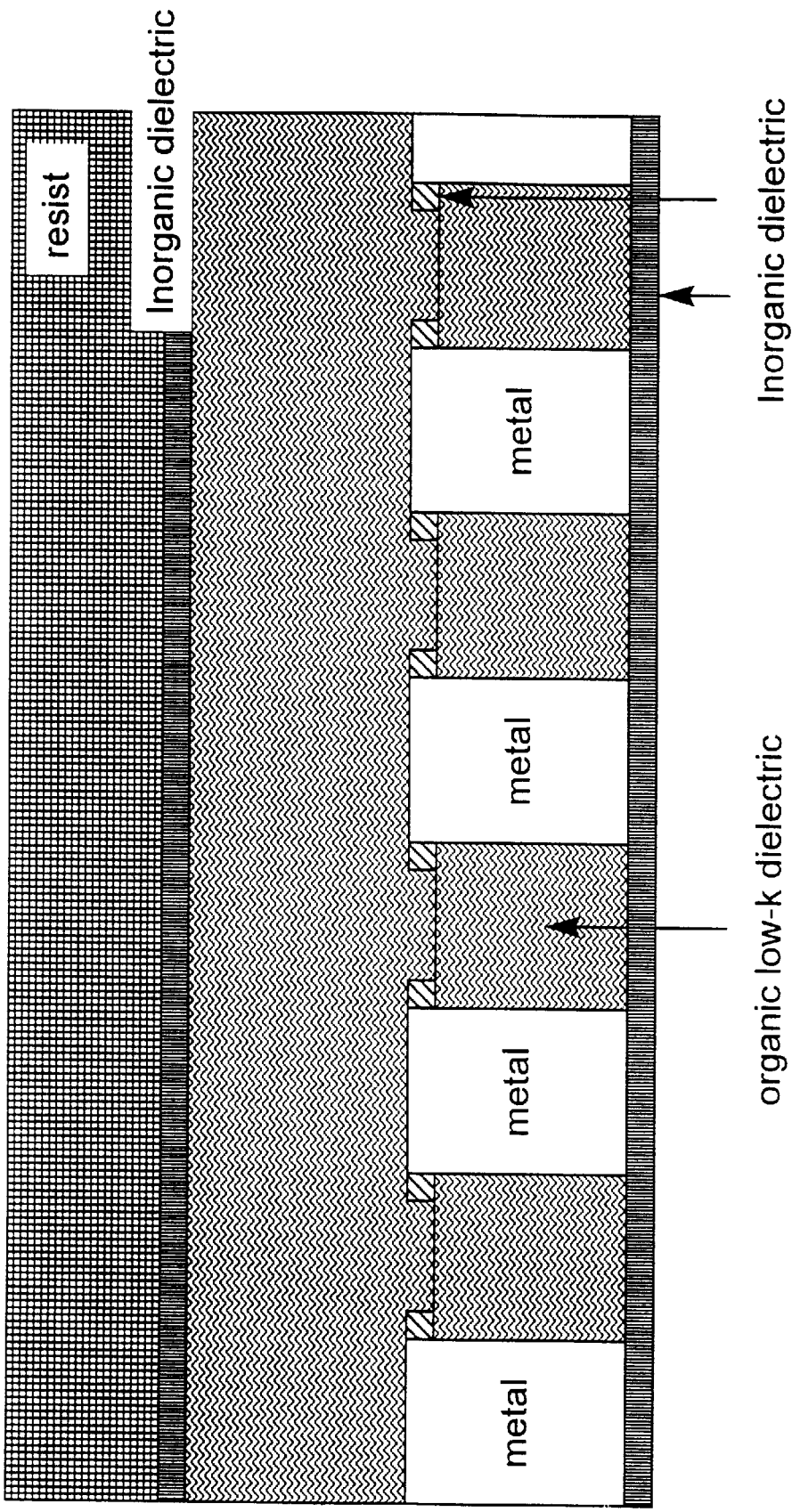
FIG. 5B shows the formation process resulting after deposition of an organic dielectric, organic dielectric etchback, inorganic dielectric deposition, anisotropic inorganic dielectric etchback, organic dielectric deposition, sacrificial metal deposition and resist application.
Figure 5C:
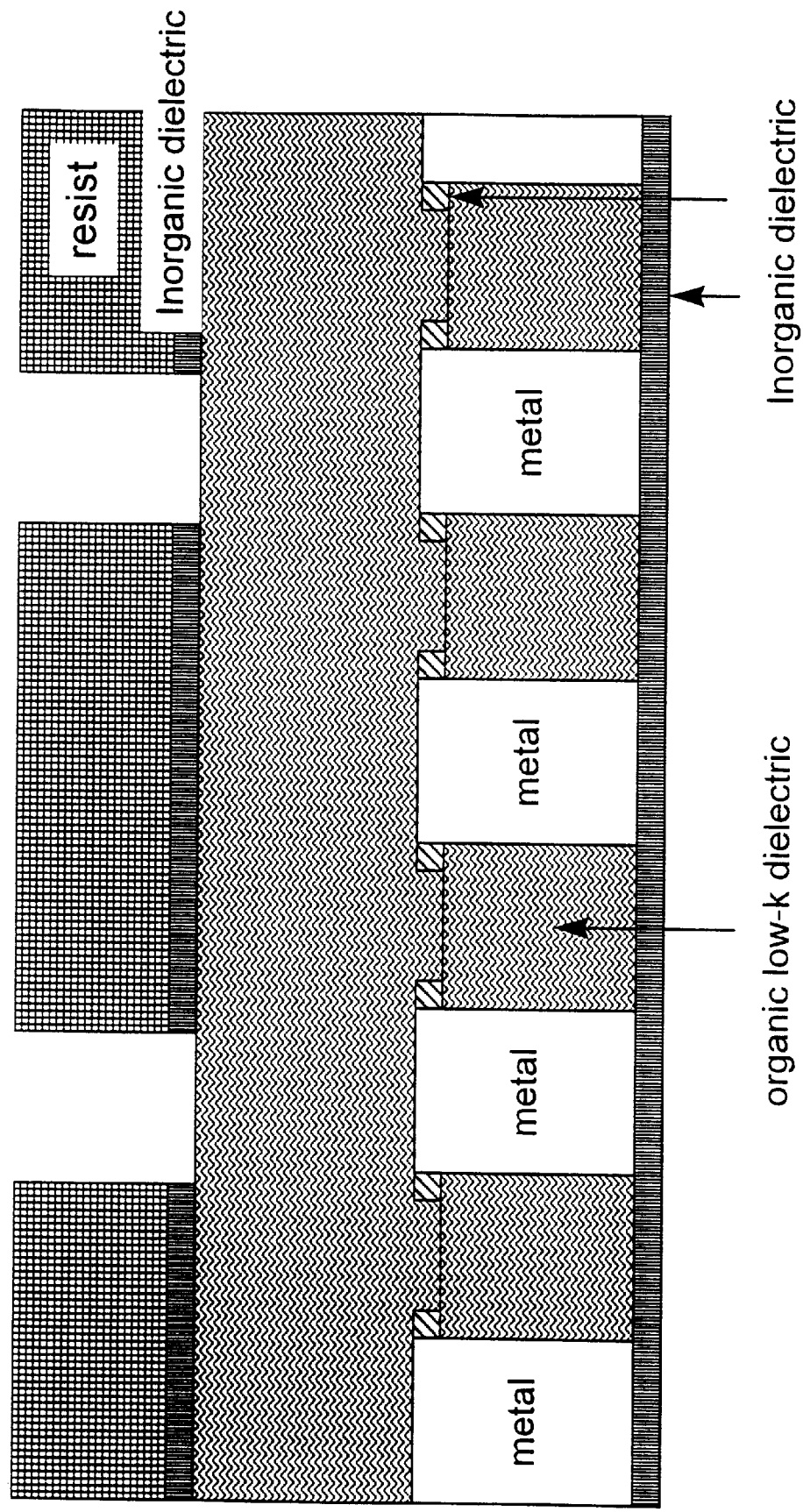
FIG. 5C shows the formation process resulting after via mask and resist development and after anisotropic inorganic dielectric etch.

A process sequence for the production of the structure of FIG. 2C is shown via FIGS. 5A through 5D. These figures show the process flow after the formation of the one interconnect level, however, the same processing steps can be repeated again for upper levels of vias and interconnects. FIG. 5A shows the interim structure at a beginning step which is a deposition of an inorganic low-k third dielectric (Dielectric III) onto a substrate and forming a pattern of metal contacts on the layer of the third dielectric material. Typical materials for the substrates and metal contacts have been described above. Deposition of the third dielectric onto the substrate may be conducted as above and metal lines may be deposited by lithographic techniques.

Figure 5D:
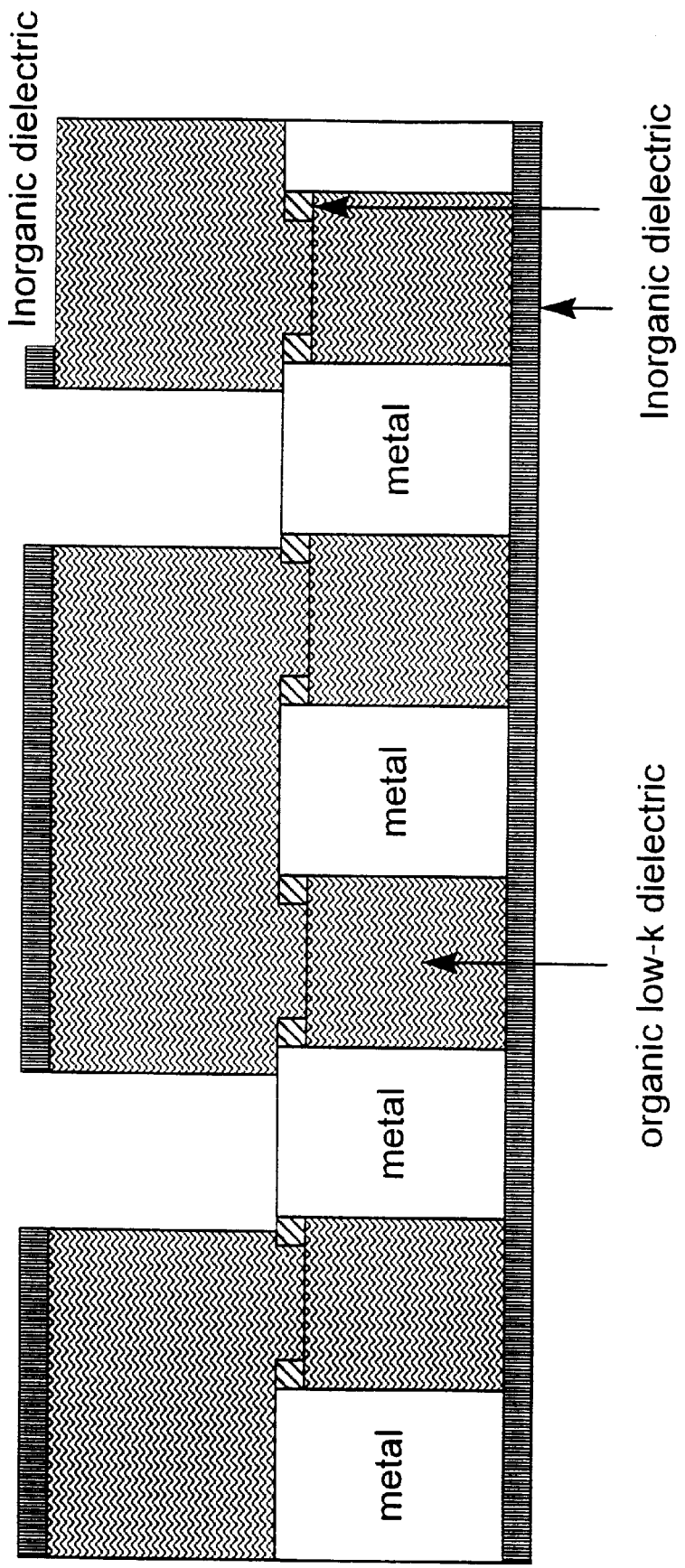
FIG. 5D shows the formation process resulting after anisotropic organic dielectric etch.
Figure 6:
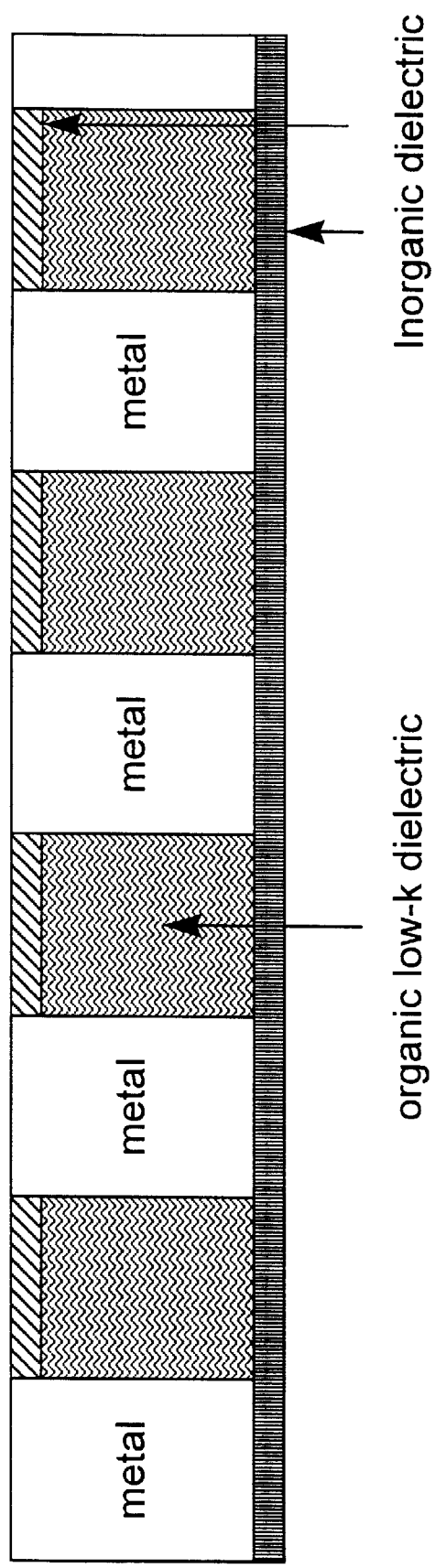
FIG. 6 shows a formation process step for a fourth embodiment of the invention, architecture IV resulting after chemical mechanical polishing of the inorganic dielectric.

The next several process steps are done similarly to those for embodiments I and II. The next process step is to conformally deposit a lining of a second dielectric material (dielectric II) between the side walls of the metal contacts, as well as on a top surface of the metal contacts as done above. The next step is removing the second dielectric material from the top surface of the metal contacts and forming a recess in the space between adjacent side walls of the metal contacts similarly as above. One then deposits a layer of a first dielectric material (Dielectric I) in the recess and on the top surface of the metal contacts. The recess is then filled by depositing a first dielectric material therein thus forming ledges. In a third embodiment of the invention according to new architecture III of FIG. 2C, the ledges partially span the width of the filled space between adjacent side walls, and then area between adjacent ledges is filled with the second dielectric material. In a fourth embodiment of the invention according to new architecture IV of FIG. 2D, the ledge spans the distance between adjacent metal contacts as may also be seen in FIG. 6. In order to form the third embodiment, one deposits a conformal layer of the first dielectric material over the metal contacts and over side edges of the ledges. One then removes the first dielectric material from the central portion of the ledges while leaving the portion of the first dielectric material at side edges of the ledges by anisotropic etchback. In step 6 one depositing an additional layer of the second dielectric material on the top surface of the metal contacts, and on the ledges and in any removed central portion of the ledges. For new architecture III the second dielectric material is on and between ledges while for new architecture IV, second dielectric material is only on the ledges. In step 7 one deposits an additional layer of Dielectric III on the additional layer of the second dielectric material. The layer of Dielectric III separates the underlying organic dielectric previously deposited from the resist to be spun in the next step. Dielectric III protects the underlying organic dielectric when resist is removed after the completion of opening via. In step 8 one deposits a layer of a photoresist on the layer of the additional layer of Dielectric III to thereby produce the structure of FIG. 5B. After imagewise removing a portion of the photoresist over at least one metal contact and optionally over at least a portion of the ledges and after removing the portion of the layer of the additional layer of Dielectric III under the removed portion of the photoresist in a step 10, the structure of FIG. SC is obtained. In step 11, one performs an anisotropic organic dielectric etch. The etch of the exposed organic dielectric, in oxygen-based plasma chemistry, stops by itself on reaching on the metal and the inorganic dielectric on the ledges due to a very high etch selectivity between organic dielectric and metal and between organic and inorganic dielectrics. At the completion of this step, via holes are fully opened without deep and narrow trenches produced on the side of metal lines. The resist, being organic, is simultaneously removed and the structure of FIG. 5D is obtained. One then deposits a layer of a barrier metal on the sacrificial metal layer, and on inside walls and a floor of the vias and fills the vias with a fill metal and deposits a layer of a fill metal on the layer of the barrier metal as before. One then removes the fill metal layer and the barrier metal layer. The process steps used for the fabrication of the via and metal levels can be repeated again for the upper levels of vias and metals.

The process steps for preparing the structures of new architectures V and VI are similar to those for producing new architectures I and II except the organic and inorganic dielectrics are reversed.

Figure 2E:
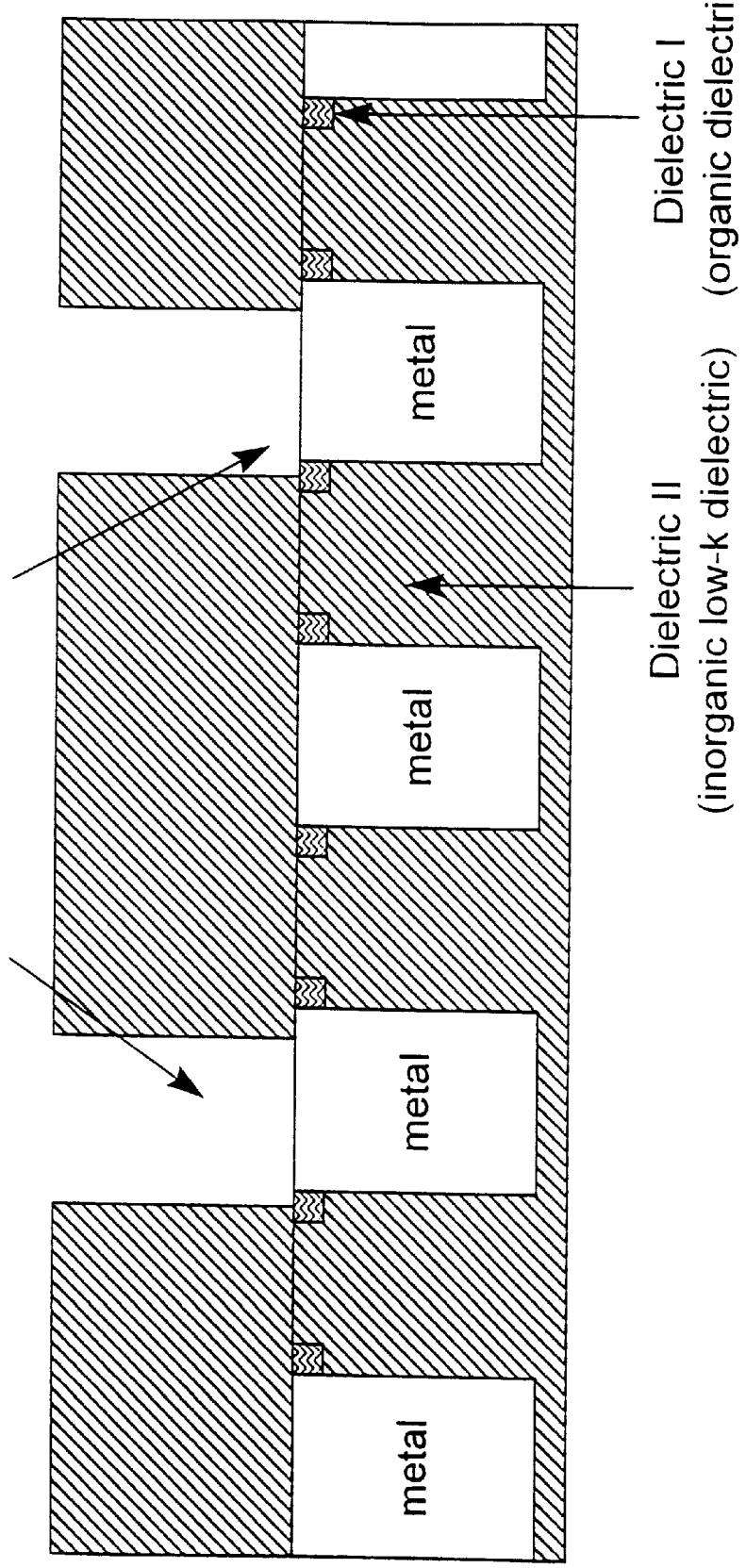
FIG. 2E shows a fifth embodiment of a new integrated circuit architecture V according to the invention.
Figure 2F:
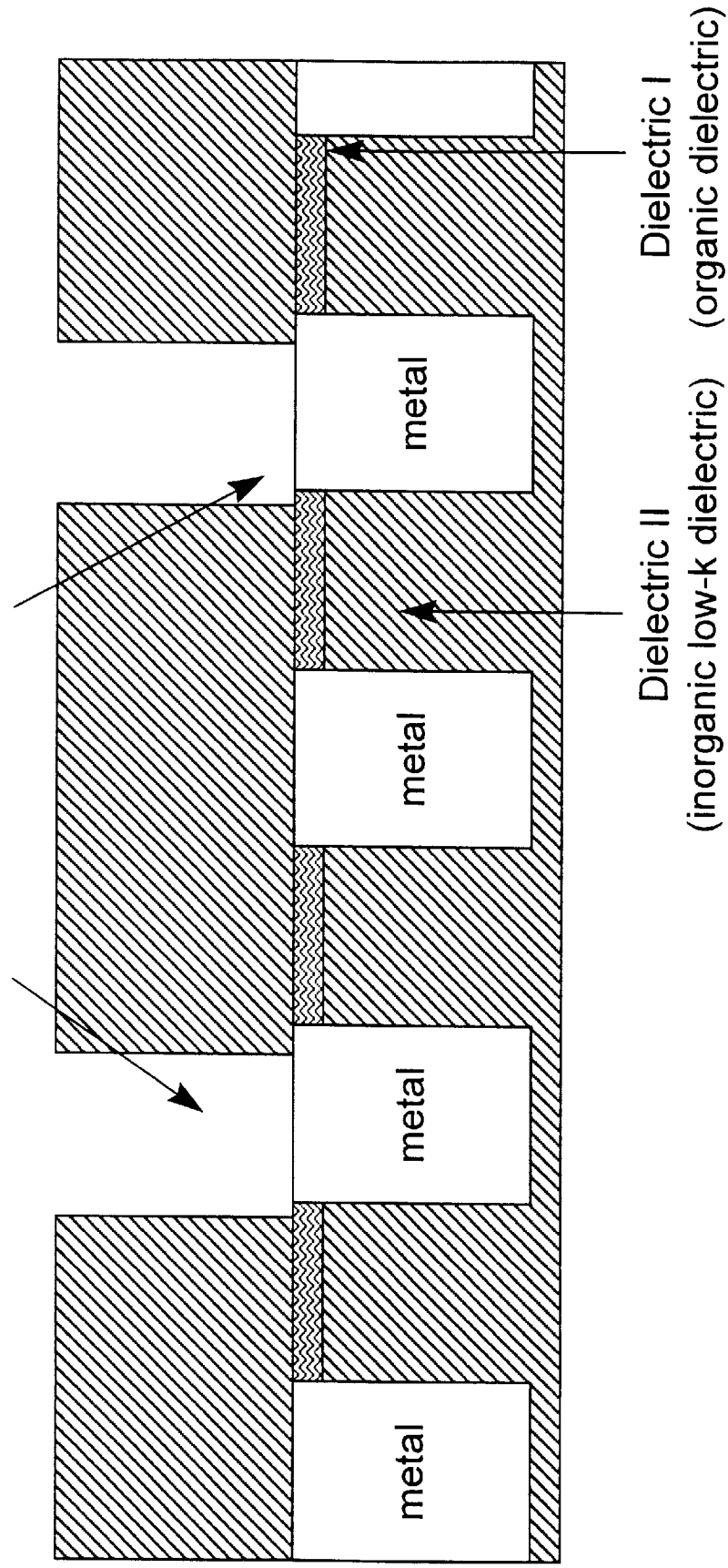
FIG. 2F shows a sixth embodiment of a new integrated circuit architecture VI according to the invention.
Figure 7A:
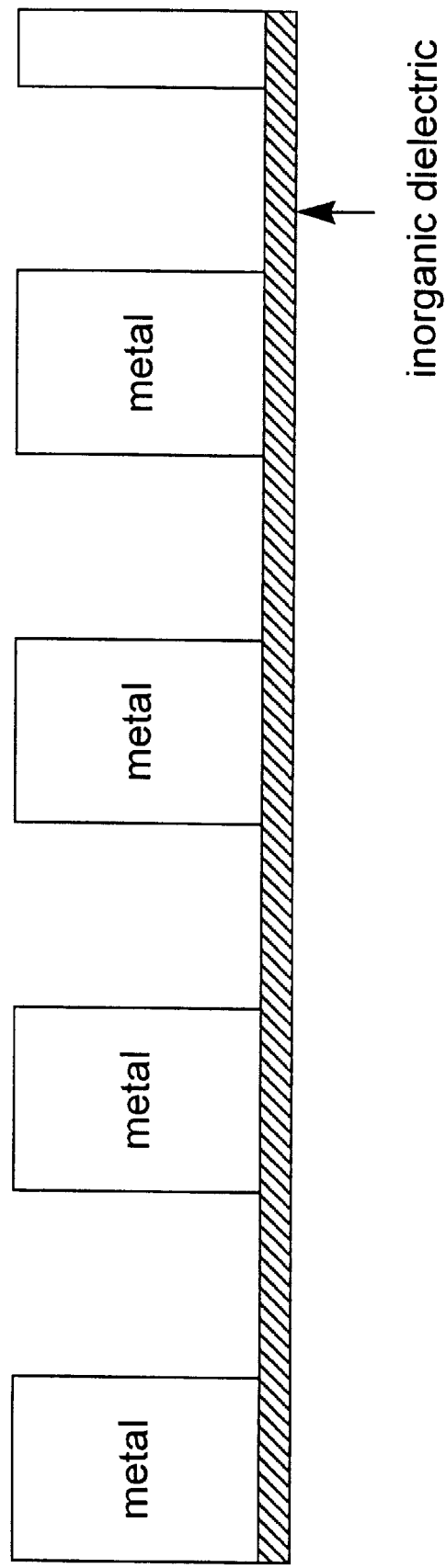
FIG. 7A shows the result of the first step of the formation process for a fifth embodiment of the invention, architecture V, resulting after metal patterning.
Figure 7B:
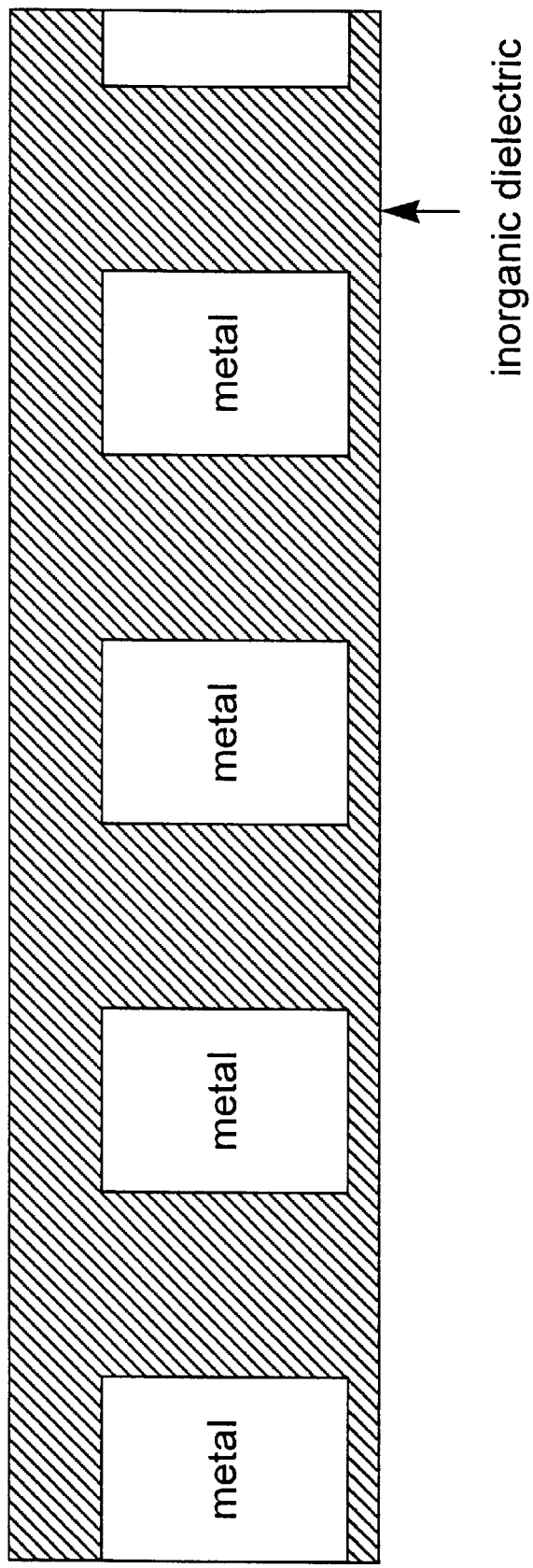
FIG. 7B shows the formation process resulting after conformal deposition of an inorganic dielectric.

A first process embodiment of the invention for producing new architectures V and VI of FIGS. 2E and 2F is exemplified by FIGS. 7A through 7L. These figures show the process flow after the formation of the one interconnect level, however, the same processing steps can be repeated again for upper levels of vias and interconnects. FIG. 7A shows the interim structure at a beginning step which is a deposition of an inorganic low-k dielectric (Dielectric I) onto a substrate and forming a pattern of metal contacts on the layer of the first dielectric material. Typical substrates and metal contact materials include those listed above. The first process step is to conformally deposit a lining of the first inorganic dielectric material (Dielectric I) between the side walls of the metal contacts, as well as on a top surface of the metal contacts as shown in FIG. 7B.

Figure 7C:
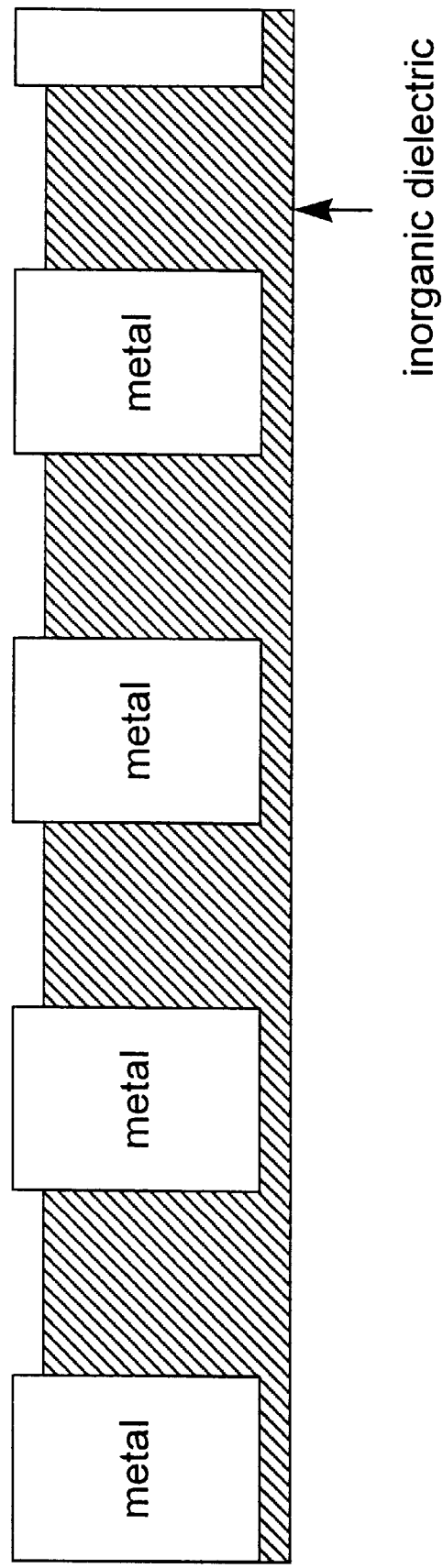
FIG. 7C shows the formation process resulting after inorganic dielectric etchback.
Figure 7D:
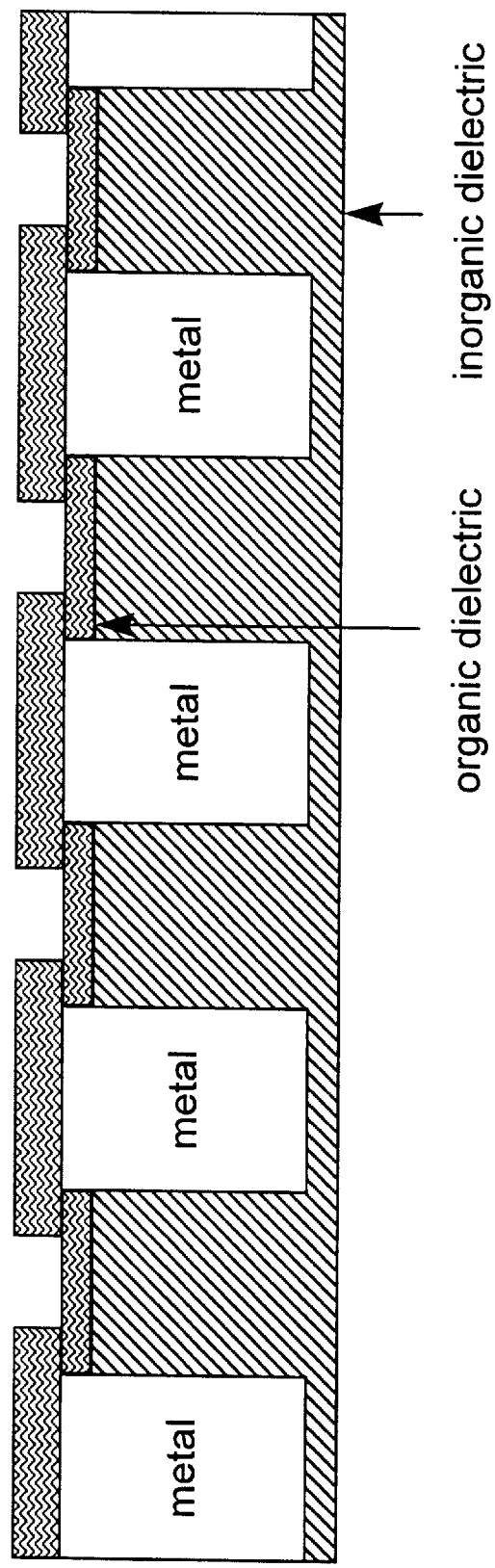
FIG. 7D shows the formation process resulting after organic dielectric deposition.
Figure 7E:
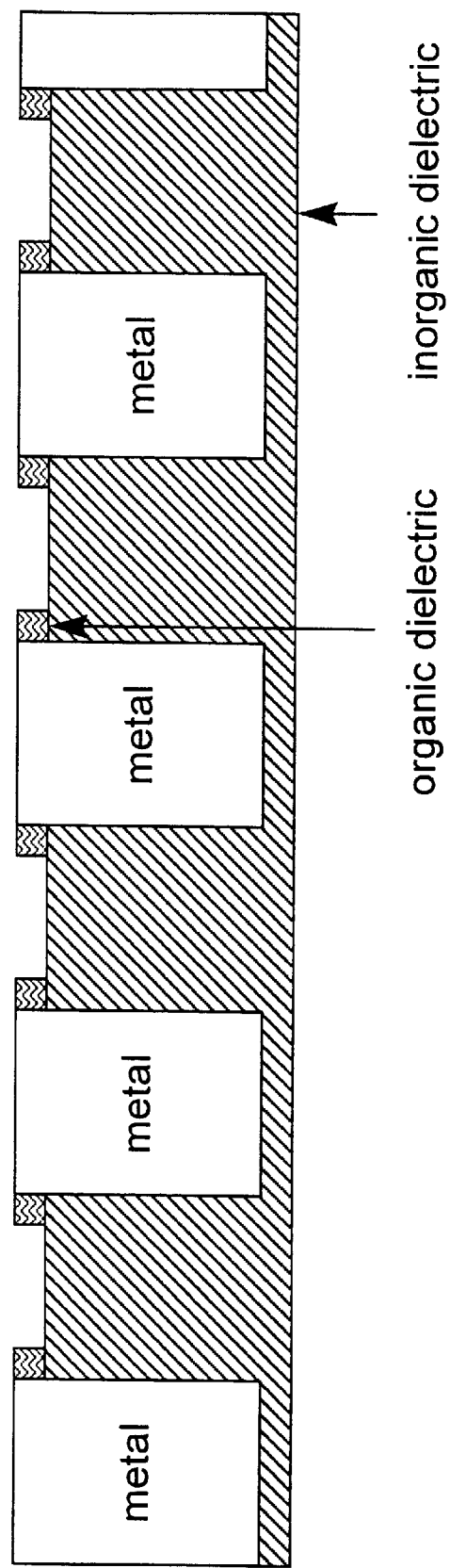
FIG. 7E shows the formation process resulting after organic dielectric etchback.
Figure 7F:
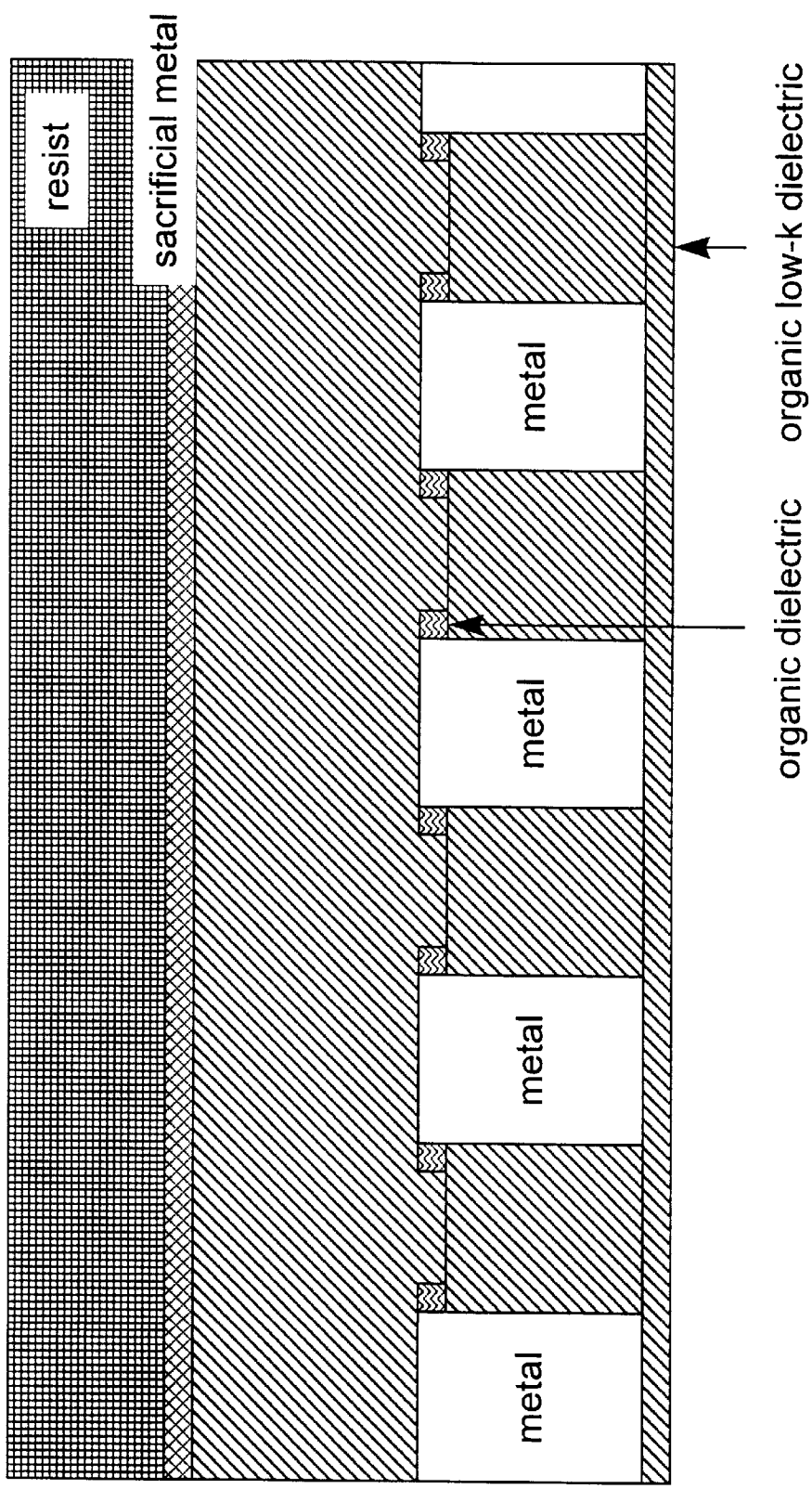
FIG. 7F shows the formation process resulting after inorganic dielectric deposition, sacrificial metal deposition, resist spin and bake.
Figure 7G:
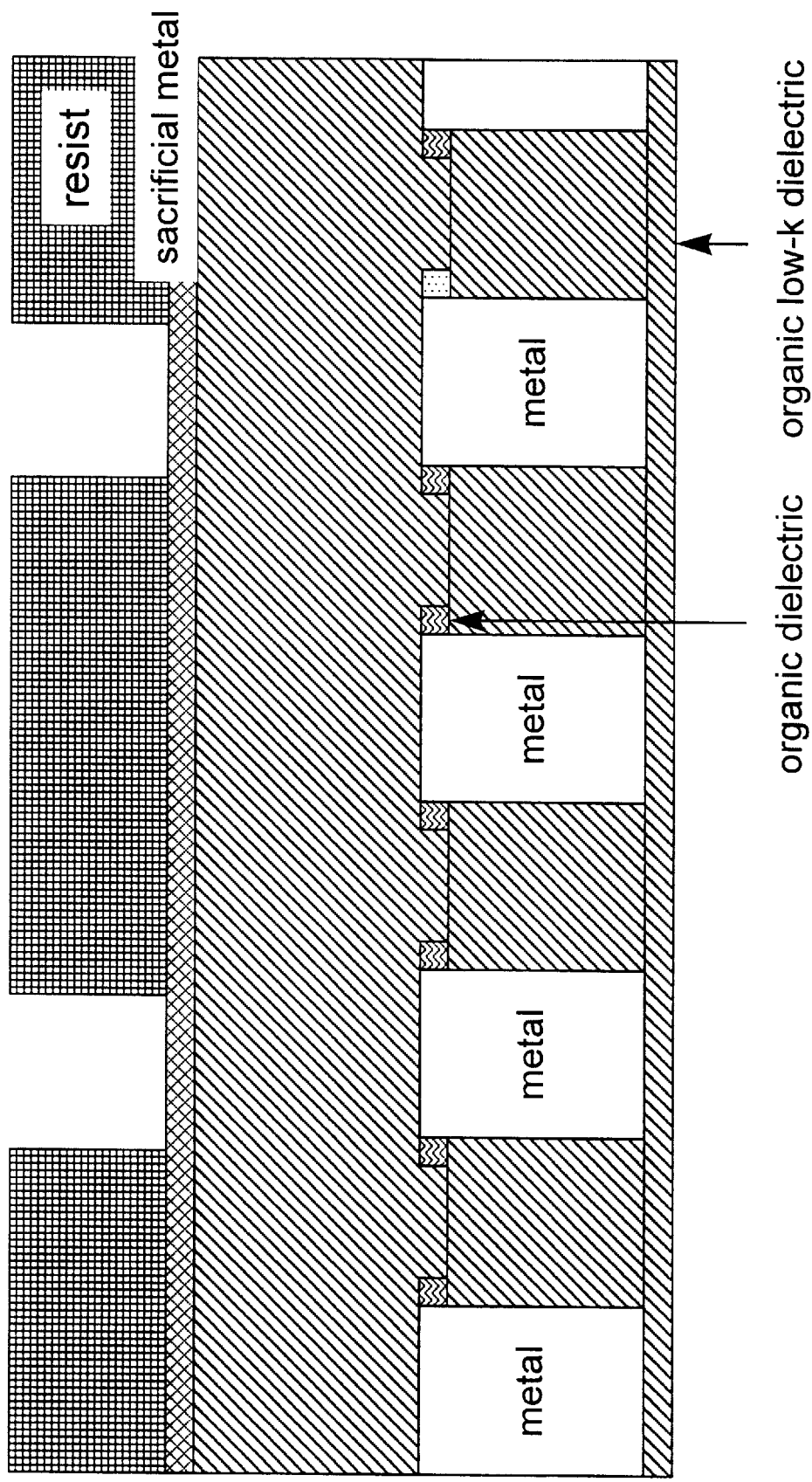
FIG. 7G shows the formation process resulting after via mask and resist development.
Figure 7H:
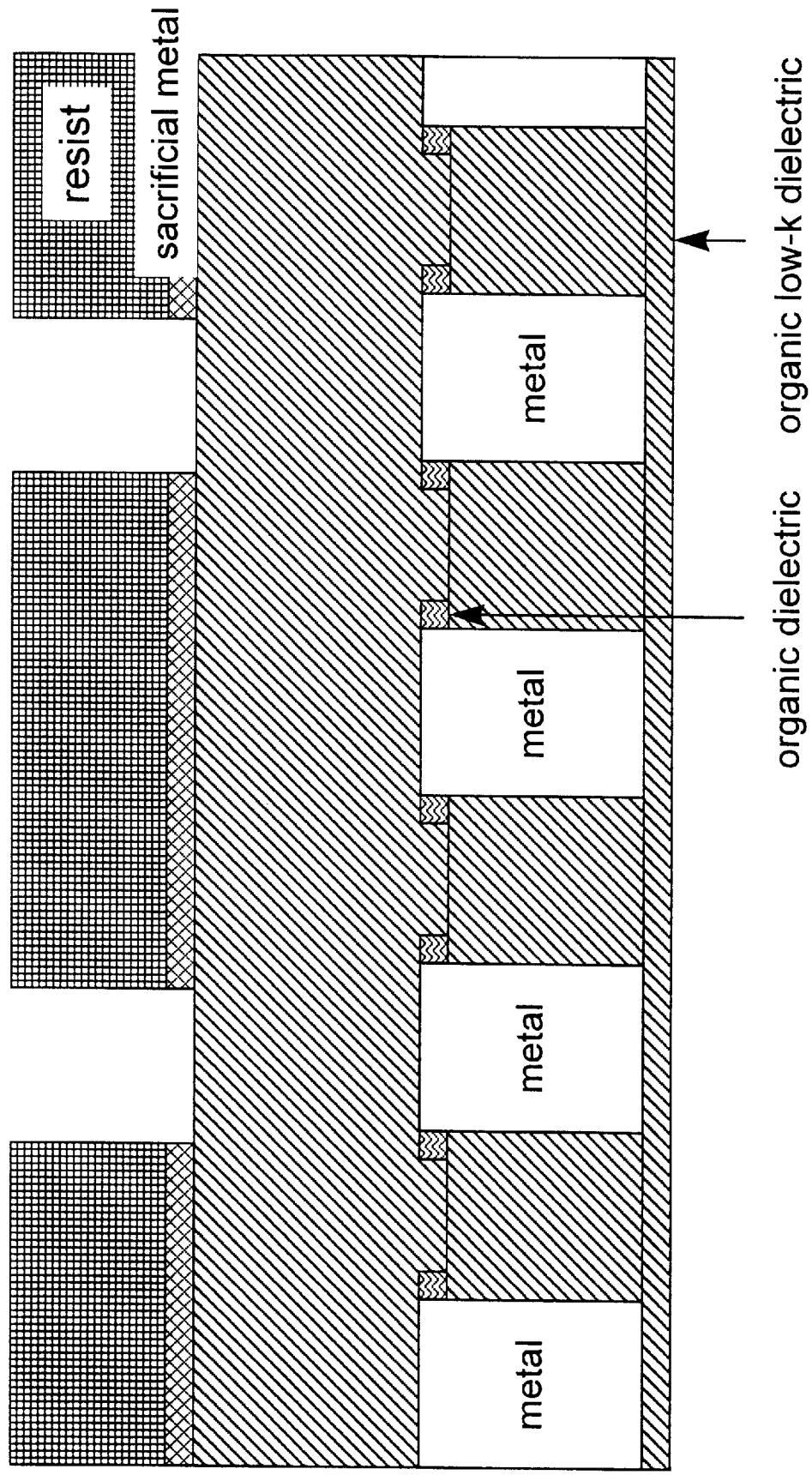
FIG. 7H shows the formation process resulting after sacrificial metal etch.
Figure 7I:
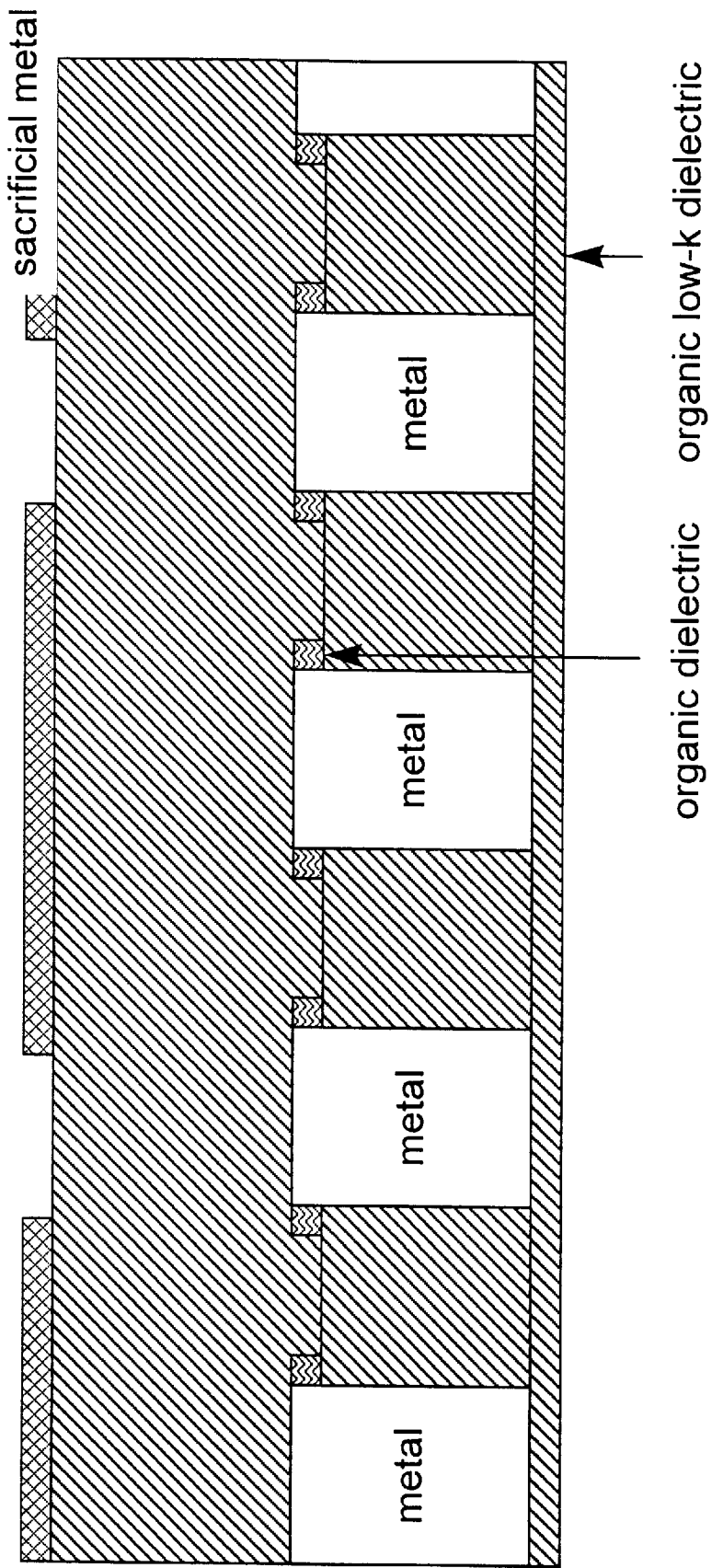
FIG. 7I shows the formation process resulting after resist removal.
Figure 7J:
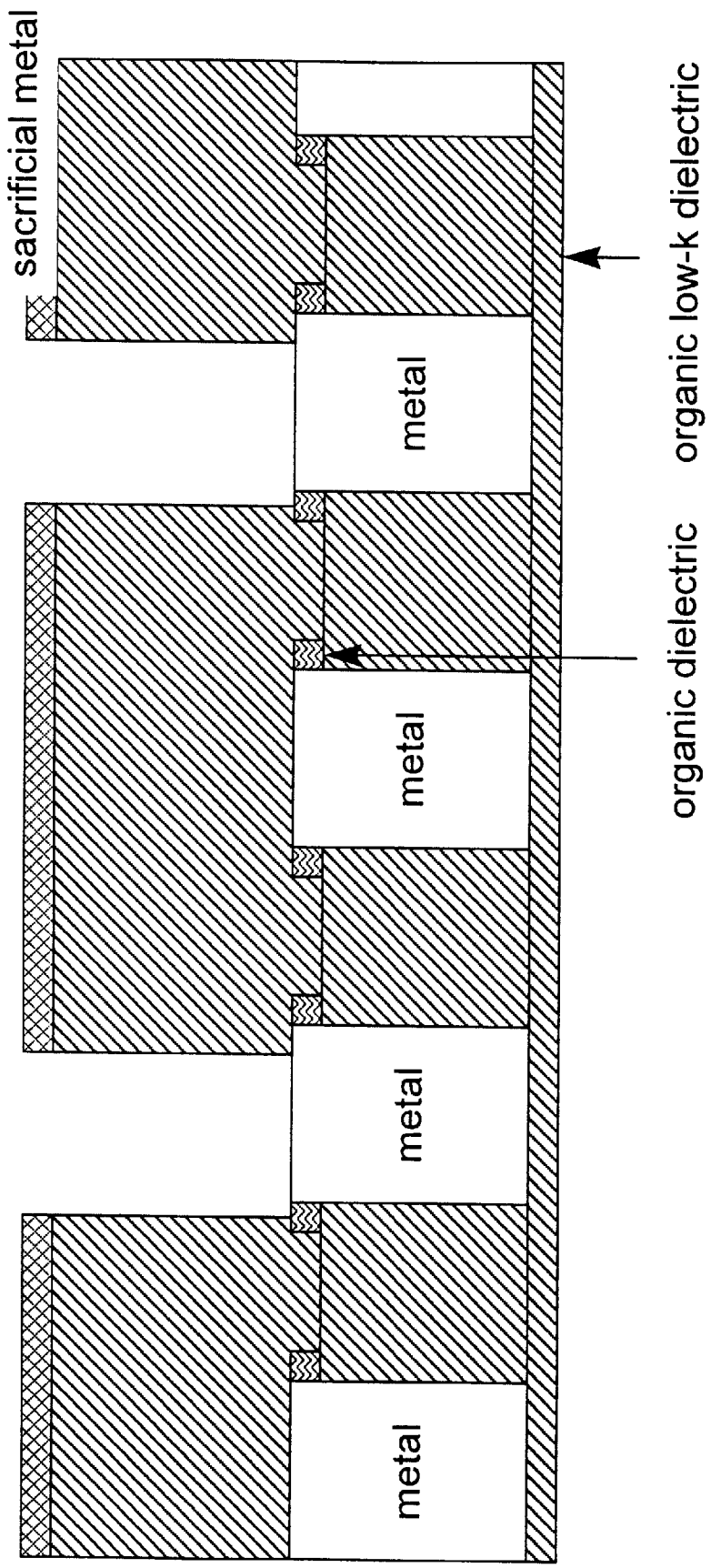
FIG. 7J shows the formation process resulting after inorganic dielectric etch.
Figure 7K:
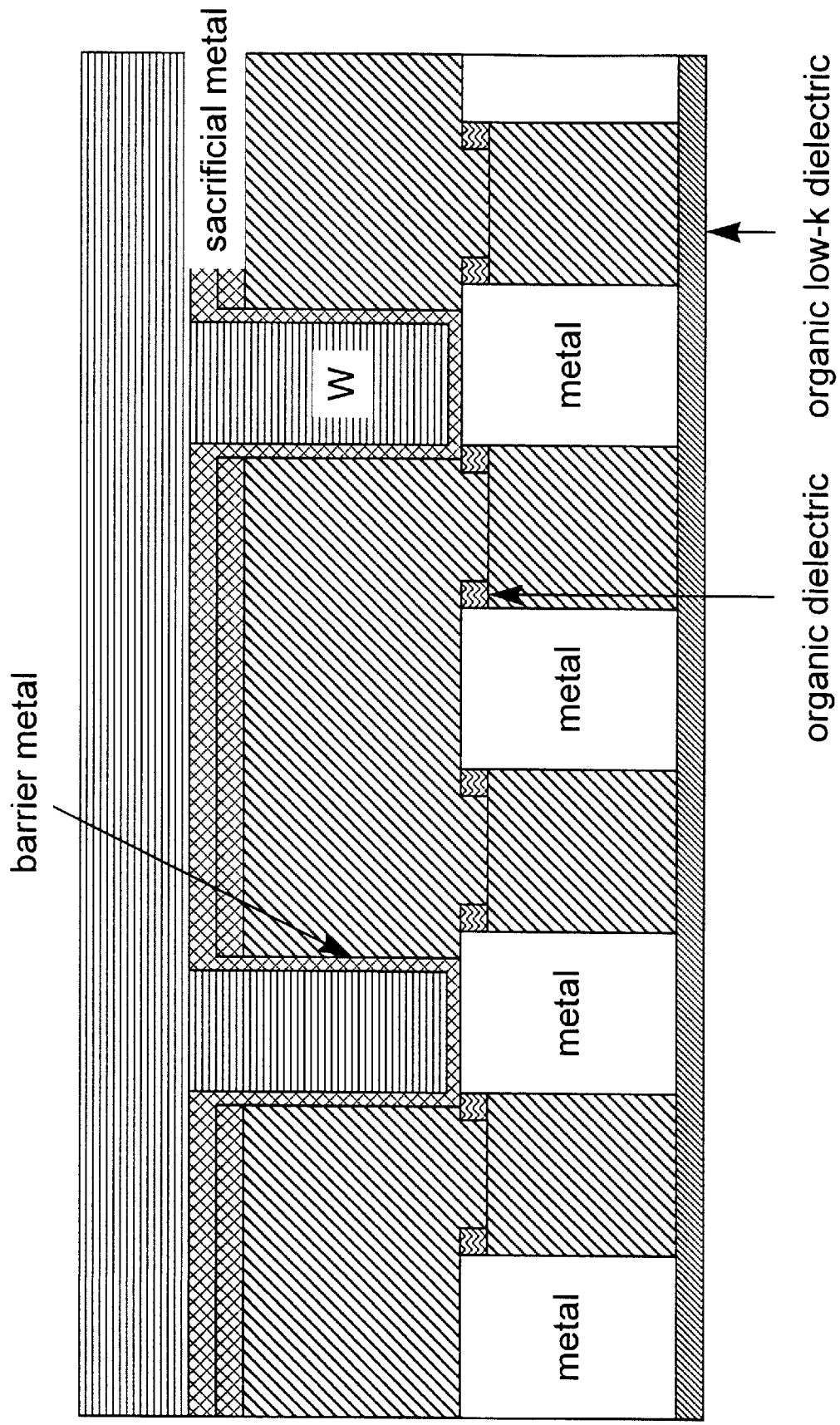
FIG. 7K shows the formation process resulting after barrier metal and tungsten depositions.
Figure 7L:
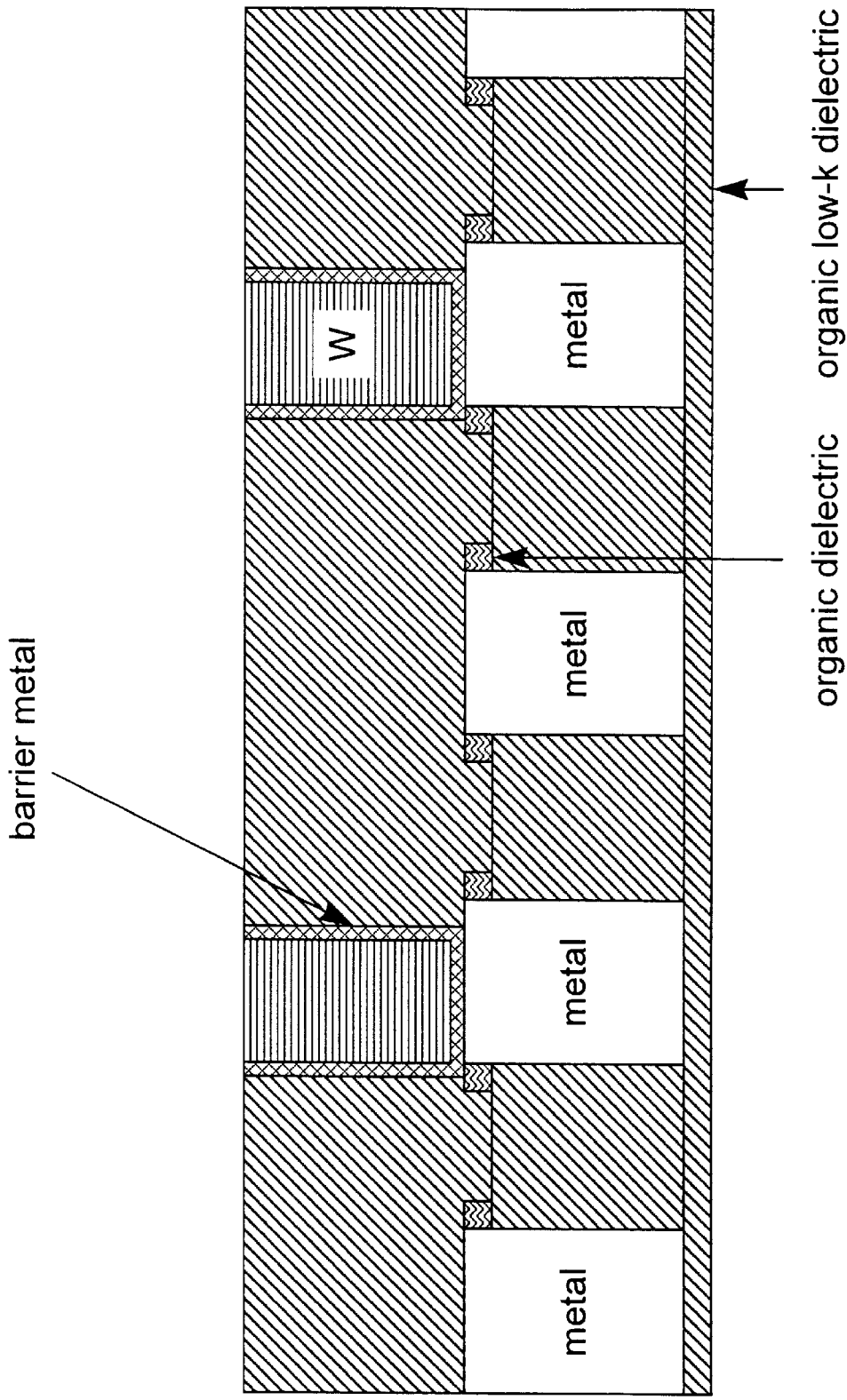
FIG. 7L shows the formation process resulting after chemical mechanical polishing of the tungsten, barrier metal and sacrificial metal.
Figure 8:
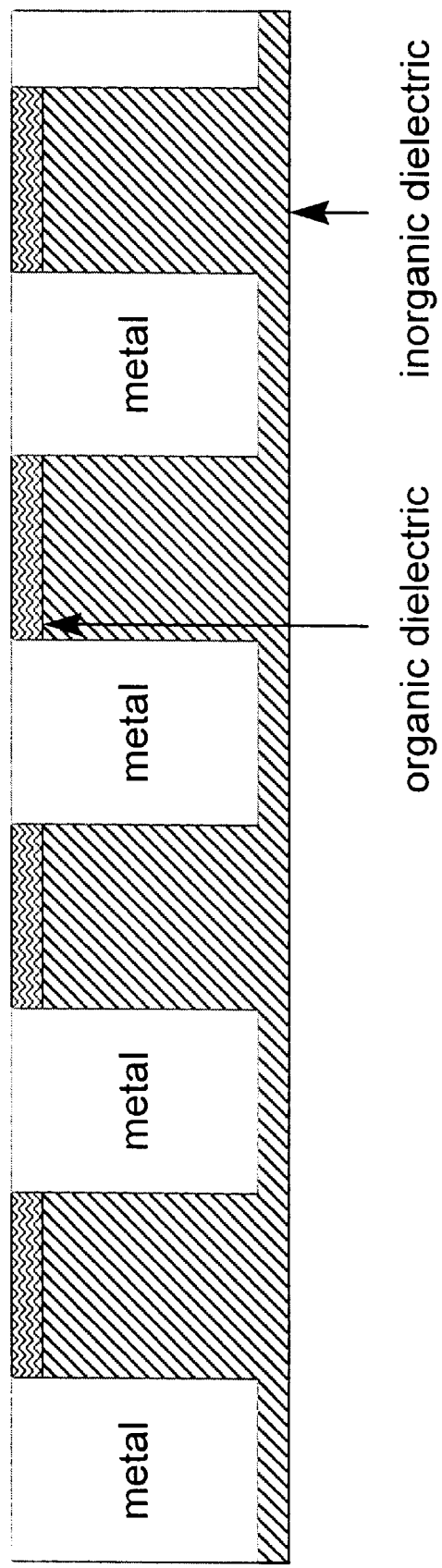
FIG. 8 shows a formation process step for a sixth embodiment of the invention, architecture VI resulting after chemical mechanical polishing of the inorganic dielectric. Prior steps are analogous to FIGS. 7A–7D and subsequent steps are analogous to FIGS. 7F–7L.

The next step 2 is removing the first inorganic dielectric material from the top surface of the metal contacts and forming a recess in the space between adjacent side walls of the metal contacts as shown in FIG. 7C. In step 3 one then deposits a layer of a second organic dielectric material (Dielectric II) in the recess and on the top surface of the metal contacts. The recess is then filled by depositing Dielectric II material therein thus forming ledges. In a fifth embodiment of the invention according to new architecture V of FIG. 2E, the ledges partially span the width of the filled space between adjacent side walls, and then area between adjacent ledges is filled with the second dielectric material. In the sixth embodiment of the invention according to new architecture VI of FIG. 2F, the ledge spans the distance between adjacent metal contacts, as may be seen in FIG. 8. In order to form the fifth embodiment, one deposits a conformal layer of the Dielectric II material over the metal contacts and over side edges of the ledges as seen in FIG. 7D. In step 4 one then removes the second organic dielectric material from the central portion of the ledges while leaving the portion of the organic dielectric material at side edges of the ledges as seen in FIG. 7E. This is done by anisotropic etchback. In step 5 one deposit an additional layer of the first dielectric material on the top surface of the metal contacts, and on the ledges and in any removed central portion of the ledges. For architecture V the first dielectric material is on and between ledges while for architecture VI, first dielectric material is only on the ledges. In step 6 one deposits a layer of a sacrificial metal on the additional layer of the second dielectric material. The layer of a sacrificial metal separates the underlying inorganic dielectric previously deposited from the resist to be spun in the next step. Significantly high etch selectivity can be easily achieved between inorganic dielectrics and metal thin film and between organic dielectrics and metal thin films. The sacrificial metal protects the underlying organic dielectric when resist is removed after the completion of opening via. In step 7 one deposits a layer of a photoresist on the layer of the sacrificial metal layer to thereby produce the structure of FIG. 7F. After imagewise removing a portion of the photoresist over at least one metal contact and optionally over at least a portion of the ledges in step 8, the structure of FIG. 7G is attained. After removing the portion of the layer of the sacrificial metal under the removed portion of the photoresist in a step 9, the structure of FIG. 7H is obtained. This is done by anisotropic sacrificial metal etch. In step 10, one removes the balance of the photoresist to obtain the structure of FIG. 7I. One then performs step 11 which is an anisotropic inorganic dielectric etch. The etch of the exposed inorganic dielectric stops by itself on reaching on the metal and the organic dielectric ledges due to a very high etch selectivity between organic dielectric and metal and between organic and inorganic dielectrics. At the completion of this step, via holes are fully opened without deep and narrow trenches produced on the side of metal lines. Furthermore, the sacrificial metal has become redundant and is to be removed later. The structure of FIG. 7J results. One then deposits a layer of a barrier metal on the sacrificial metal layer, and on inside walls and a floor of the vias and fills the vias with a fill metal and deposits a layer of a fill metal on the layer of the barrier metal in a step 12 to produce the structure of FIG. 7K. One then removes the fill metal layer, the barrier metal layer and the sacrificial metal layer, such as by chemical mechanical polishing, to obtain the structure of FIG. 7L. The process steps used for the fabrication of the via and metal levels can be repeated again for the upper levels of vias and metals.

While the present invention has been particularly shown and described with reference to preferred embodiments, it will be readily appreciated by those of ordinary skill in the art that various changes and modifications may be made without departing from the spirit and scope of the invention. It is intended that the claims be to interpreted to cover the disclosed embodiment, those alternatives which have been discussed above and all equivalents thereto.

What is claimed is:

1. An integrated circuit structure which comprises:
   (a) a substrate;
   (b) a layer of a second dielectric material positioned on the substrate;
   (c) a plurality of spaced apart metal contacts on the layer of the second dielectric material, which metal contacts have side walls;
   (d) a space between adjacent metal contact side walls, each space being filled with the second dielectric material;
   (e) at least one ledge of a first dielectric material on top of at least one second dielectric material filled space and which ledge is attached to adjacent side walls such that each ledge either
      i) fully spans the width of the filled space between adjacent side walls; or
      ii) partially spans the width of the filled space between adjacent side walls, and the area between adjacent ledges is filled with second dielectric material;
   a top surface of each of the metal contacts, a top surface of the ledges and a top surface of any filled areas between adjacent ledges being at a common level;
   (f) an additional layer of the second dielectric material on at least some of the metal contacts, at least one of the ledges and optionally the filled areas between adjacent ledges;
   (g) at least one via extending through the additional layer of the second dielectric material and extending to the top surface of at least one metal contact and optionally at least one of the ledges;
wherein the first dielectric material and the second dielectric material have substantially different etch resistance properties.

2. The integrated circuit structure of claim 1 wherein the at least one via is filled with at least one metal.

3. The integrated circuit structure of claim 1 wherein the first dielectric material is organic and the second dielectric material is inorganic.

4. The integrated circuit structure of claim 1 wherein the first dielectric material is inorganic and the second dielectric material is organic.

5. The integrated circuit structure of claim 1 wherein each ledge fully spans the width of the filled space between adjacent side walls.

6. The integrated circuit structure of claim 1 wherein each ledge partially spans the width of the filled space between adjacent side walls, and the area between adjacent ledges is filled with second dielectric material.

7. An integrated circuit structure which comprises:
   (a) a substrate;
   (b) a layer of a third dielectric material positioned on the substrate;
   (c) a plurality of spaced apart metal contacts on the layer of the third dielectric material, which metal contacts have side walls;
   (d) a space between adjacent metal contact side walls, each space being filled with a second dielectric material;
   (e) at least one ledge of a first dielectric material on top of each second dielectric material filled space and which ledge is attached to adjacent side walls such that each ledge either
      i) fully spans the width of the filled space between adjacent side walls; or
      ii) partially spans the width of the filled space between adjacent side walls, and the area between adjacent ledges is filled with second dielectric material;
   a top surface of each of the metal contacts, a top surface of the ledges and a top surface of any filled areas between adjacent ledges being at a common level;
   (f) an additional layer of the second dielectric material on at least some of the metal contacts, at least one of the ledges and optionally the filled areas between adjacent ledges;
   (g) an additional layer of the third dielectric material on the additional layer of the second dielectric material;
   (h) at least one via extending through the additional layer of the second dielectric material and the additional layer of the third dielectric material, and extending to the top surface of at least one metal contact and optionally at least one of the ledges;
wherein the first dielectric material and the second dielectric material have substantially different etch resistance properties and wherein the second dielectric material and the third dielectric material have substantially different etch resistance properties.

8. The integrated circuit structure of claim 7 wherein the at least one via is filled with at least one metal.

9. The integrated circuit structure of claim 7 wherein the first and third dielectric materials are organic and the second dielectric material is inorganic.

10. The integrated circuit structure of claim 7 wherein the first and third dielectric materials are inorganic and the second dielectric material is organic.

11. The integrated circuit structure of claim 7 wherein each ledge fully spans the width of the filled space between adjacent side walls.

12. The integrated circuit structure of claim 7 wherein each ledge partially spans the width of the filled space between adjacent side walls, and the area between adjacent ledges is filled with second dielectric material.

* * * * *